US012772564B2

(12) United States Patent
Kim et al.

(10) Patent No.: US 12,772,564 B2
(45) Date of Patent: Oct. 20, 2026

(54) DISPLAY DEVICE

(71) Applicant: LG Display Co., Ltd., Seoul (KR)

(72) Inventors: ChangEun Kim, Seoul (KR); Jinuk Lee, Seoul (KR); Joong Ha Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 424 days.

(21) Appl. No.: 18/484,867

(22) Filed: Oct. 11, 2023

(65) Prior Publication Data

US 2024/0128281 A1 Apr. 18, 2024

(30) Foreign Application Priority Data

Oct. 13, 2022 (KR) ........................ 10-2022-0131215

(51) Int. Cl.

| | |
|---|---|
| *C22C 32/00* | (2006.01) |
| *G02F 1/1362* | (2006.01) |
| *G02F 1/1368* | (2006.01) |
| *H10D 30/67* | (2025.01) |
| *H10D 64/62* | (2025.01) |
| *H10D 86/40* | (2025.01) |
| *H10D 86/60* | (2025.01) |

(52) U.S. Cl.

CPC ......... *H10D 86/60* (2025.01); *C22C 32/0031* (2013.01); *G02F 1/136209* (2013.01); *G02F 1/136295* (2021.01); *G02F 1/1368* (2013.01); *H10D 30/6723* (2025.01); *H10D 30/6739* (2025.01); *H10D 64/62* (2025.01); *H10D 86/441* (2025.01)

(58) Field of Classification Search

CPC ............... H10D 86/60; H10D 30/6723; H10D 30/6739; H10D 64/62; H10D 86/441; C22C 32/0031; C22C 29/12; G02F 1/136209; G02F 1/136295; G02F 1/1368; G02F 1/1345; G02F 1/136286

See application file for complete search history.

(56) References Cited

U.S. PATENT DOCUMENTS

2006/0017710 A1* 1/2006 Lee ...................... G06F 3/0447 345/173
2016/0233291 A1 8/2016 Lim et al.

FOREIGN PATENT DOCUMENTS

| | | | |
|---|---|---|---|
| KR | 10-2012-0126528 | A | 11/2012 |
| KR | 10-2012-0133130 | A | 12/2012 |
| KR | 10-2015-0077552 | A | 7/2015 |
| KR | 20200049733 | A | 5/2020 |

* cited by examiner

*Primary Examiner* — Elias Ullah
(74) *Attorney, Agent, or Firm* — Seed Intellectual Property Law Group LLP

(57) ABSTRACT

The present disclosure relates to a display device. According to the present disclosure, since conductive layers disposed on a substrate include a layer formed of a material having a low reflectance, defects in which the conductive layers are visually recognized by a user and visibility decreases can be resolved.

25 Claims, 10 Drawing Sheets

DISPLAY DEVICE

CROSS-REFERENCE TO RELATED APPLICATIONS

This application claims the benefit of and priority to Korean Patent Application No. 10-2022-0131215 filed on Oct. 13, 2022 in the Republic of Korea, the entire contents of which are hereby expressly incorporated by reference into the present application.

BACKGROUND

Technical Field

The present disclosure relates to a display device, and more particularly, to a display device having improved reflectance and visibility.

Description of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly. Examples of the display device include a liquid crystal display device (LCD), an organic light emitting display device (OLED), and the like.

BRIEF SUMMARY

Recently, flip-over-type display devices using a substrate on which thin film transistors are disposed as a viewing surface are being actively developed. In particular, in the flip-over type display device, since the substrate on which the thin film transistor is disposed is configured as an upper substrate, a pad unit is disposed toward a rear side of a panel, thus, it is possible to not include equipment such as an external cover for covering the pad unit. If the external cover is not present, a four-sided borderless type display device can be implemented.

However, the inventors of the present disclosure have recognized that when the substrate on which the thin film transistor is disposed is used as a viewing surface, there is a defect in which visibility is lowered at an outer portion of the panel due to a plurality of metal lines and metal electrodes.

Various embodiments of the present disclosure address the technical problems in the related art including the technical problem identified above.

For example, the present disclosure discusses methods to solve defects in which a metal layer is visually recognized by a user due to a high reflectance of conductive components such as a gate electrode and the like and visibility is lowered.

In particular, various embodiments of the present disclosure provide a borderless type display device where a width of a bezel area is minimized while resolving defects in which metal layers are visually recognized by a user and visibility decreases, in a flip-over type display device using a substrate on which thin film transistors are disposed as a viewing surface.

The technical benefits of the present disclosure are not limited to the above-mentioned benefits, and other benefits, which are not mentioned above, can be clearly understood by those skilled in the art from the following descriptions.

A display device according to an exemplary embodiment of the present disclosure includes a substrate; and a conductive layer on the substrate, wherein the conductive layer includes a first conductive layer including a first sub-conductive layer and a second sub-conductive layer disposed on the first sub-conductive layer; and a second conductive layer disposed on the first conductive layer and including a first sub-conductive layer and a second sub-conductive layer disposed on the first sub-conductive layer, wherein the first sub-conductive layer of the first conductive layer includes at least one selected from among a first low-reflective material including a first metal, a first metal oxide, a second metal oxide, and a third metal oxide; a second low-reflective material including a second metal and two or more different conductive oxides; and a third low-reflective material including a fourth metal oxide and two or more different conductive oxides, wherein the first sub-conductive layer of the second conductive layer includes at least one selected from the second low-reflective material and the third low-reflective material.

Other detailed matters of the exemplary embodiments are included in the detailed description and the drawings.

According to the present disclosure, since conductive layers disposed on a substrate include a layer formed of a material having a low reflectance, defects due to reflection in which the conductive layers are visually recognized by a user and visibility decreases can be resolved.

According to an exemplary embodiment of the present disclosure, since a gate electrode, a source electrode, and a drain electrode of a thin film transistor include a layer formed of a material with a low reflectance, a reflectance can be greatly reduced, so a reddish color due to reflection can be improved to have a neutral color. In addition, by applying conductive layers of the present disclosure to the source and drain electrodes, the reflectance is lowered and contact resistance is lowered, so that element characteristics can also be improved.

In addition, when the conductive layer of the present disclosure is applied to a flip-over type display device that utilizes a substrate on which a thin film transistor is disposed as a viewing surface, it is possible to provide a borderless type display device capable of solving defects in which a metal layer such as a gate electrode is visually recognized by a user due to reflection and visibility is reduced while a width of a bezel area can be minimized.

The effects according to the present disclosure are not limited to the contents exemplified above, and more various effects are included in the present specification.

DETAILED DESCRIPTION

Figure 1:
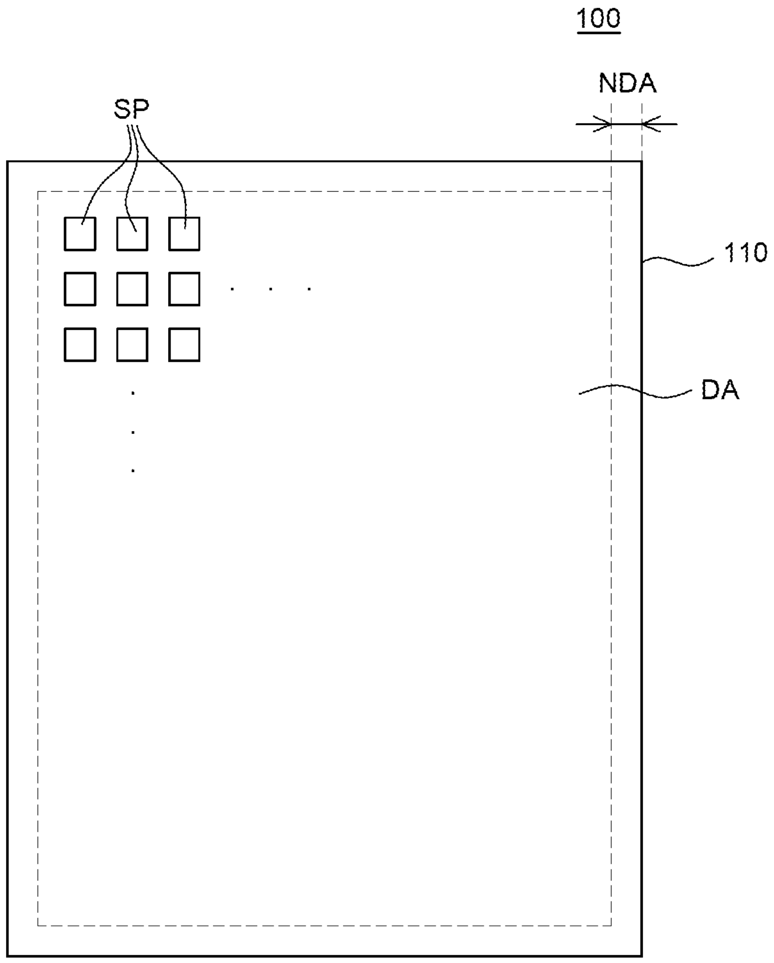
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

First, among features of the present disclosure, a first conductive layer and a second conductive layer will be described. A plurality of conductive layers, which are components of a thin film transistor, a light blocking layer, and a pad unit, may be disposed on a substrate of a display device. For example, at least one first conductive layer and at least one second conductive layer may be disposed on the substrate. In an exemplary embodiment of the present disclosure, the first conductive layer may be a gate electrode of the thin film transistor, and the second conductive layer may be a source electrode and a drain electrode of the thin film transistor. In another exemplary embodiment of the present disclosure, the first conductive layer may be the light blocking layer, and the second conductive layer may be the gate electrode.

Each of the first conductive layer and the second conductive layer includes a layer formed of a low reflective material having a low reflectance, and accordingly, the reflectance of the conductive layer formed of a metal having a high reflectance may be lowered to improve visibility of the display device.

For example, the first conductive layer may include a first sub-conductive layer and a second sub-conductive layer stacked on the first sub-conductive layer. The first sub-conductive layer of the first conductive layer serves to reduce a reflectance. The first sub-conductive layer of the first conductive layer has a reflectance lower than that of the second sub-conductive layer. The second sub-conductive layer of the first conductive layer has a resistance lower than that of the first sub-conductive layer. Accordingly, the first conductive layer including the first sub-conductive layer and the second sub-conductive layer provides an effect of decreasing the reflectance while maintaining electrical characteristics thereof so as not to be lowered.

For example, the second conductive layer may include a first sub-conductive layer and a second sub-conductive layer stacked on the first sub-conductive layer. The first sub-conductive layer of the second conductive layer serves to reduce a reflectance. The first sub-conductive layer of the second conductive layer has a reflectance lower than that of the second sub-conductive layer. The second sub-conductive layer of the second conductive layer has a resistance lower than the first sub-conductive layer. Accordingly, the second conductive layer including the first sub-conductive layer and the second sub-conductive layer has an effect of decreasing the reflectance while maintaining electrical characteristics thereof so as not to be lowered.

For example, each of the second sub-conductive layer of the first conductive layer and the second sub-conductive layer of the second conductive layer may be independently formed of one metal selected from among copper (Cu), molybdenum (Mo), aluminum (Al), chromium (Cr), gold (Au), titanium (Ti), nickel (Ni), and niobium (Nd), or an alloy including at least one of the metals, but present disclosure is not limited thereto.

For example, the first sub-conductive layer of the first conductive layer may be formed of at least one selected from among a first low-reflective material, a second low-reflective material, and a third low-reflective material.

For example, the first sub-conductive layer of the second conductive layer may be formed of at least one selected from the second low-reflective material and the third low-reflective material.

Hereinafter, the first low-reflective material, the second low-reflective material, and the third low-reflective material will be described in detail.

The first low-reflective material may include a first metal, a first metal oxide, a second metal oxide, and a third metal oxide.

For example, the first metal may be at least one selected from among molybdenum (Mo), nickel (Ni), copper (Cu), and tungsten (W).

For example, the first metal oxide may be at least one selected from among $MoO_2$, $MoO_3$, NiO, CuO and $Cu_2O$.

For example, the second metal oxide may be at least one selected from among $Nb_2O_5$, $WO_3$, $TiO_2$, $ZrO_2$ and $HfO_2$.

For example, the third metal oxide may be ZnO.

Specifically, for example, the first low-reflective material may be a combination of Mo, $MoO_2$, $MoO_3$, $Nb_2O_5$, and ZnO. In this case, the reflectance can be reduced while maintaining high electrical characteristics of the conductive layer.

For example, the first low-reflective material may include 3 wt % (% by weight) to 15 wt % of the first metal, 55 wt % to 77 wt % of the first metal oxide, 15 wt % to 30 wt % of the second metal oxide, and 0 to 5 wt % of the third metal oxide.

In another example, the first low-reflective material may include 5 wt % to 15 wt % of the first metal, 55 wt % to 68 wt % of the first metal oxide, 20 wt % to 25 wt % of the second metal oxide, and 1 wt % to 5 wt % of the third metal oxide. In this case, there is an effect of reducing the reflectance without degrading the electrical characteristics of the conductive layer.

As another example, the first low-reflective material may include 70 wt % to 80 wt % of the first metal and the first metal oxide, 15 wt % to 25 wt % of the second metal oxide, and 2 wt % to 5 wt % of the third metal oxide. In this case, a weight ratio of the first metal to the first metal oxide may be, for example, 3 to 15:85 to 97. When the first low-reflective material is configured to have such a composition, there is an effect of reducing the reflectance without degrading electrical characteristics of the conductive layer.

Specifically, for example, the first low-reflective material may be a combination of Mo, MoOx($MoO_2$+$MoO_3$), $Nb_2O_5$, and ZnO. At this time, Mo and MoOx($MoO_2$+$MoO_3$) may include a total of 70 wt % to 80 wt %, $Nb_2O_5$ may include 18 wt % to 25 wt %, and ZnO may include 2 wt % to 5 wt %. In addition, a weight ratio of Mo to MoOx($MoO_2$+$MoO_3$) may be 3 to 15:85 to 97. In addition, $MoO_2$ may be included in an amount of 90 w % or more relative to a total amount of $MoO_2$ and $MoO_3$. In this case, the reflectance can be reduced while maintaining high electrical characteristics of the conductive layer.

For example, the second low-reflective material may be formed of a second metal and two or more different conductive oxides.

For example, the second metal may be at least one selected from molybdenum (Mo) and tungsten (W).

For example, the conductive oxides may be two or more selected from among $In_2O_3$, $SnO_2$ and ZnO.

For example, the second low-reflective material may include 20 wt % to 40 wt % of the second metal and 60 wt % to 80 wt % of the conductive oxides. Within this range, the reflectance of the conductive layer may be reduced while maintaining high electrical characteristics of the conductive layer.

Optionally, if necessary, the second low-reflective material may further include a dopant. For example, the second low-reflective material may further include $MoO_2$ as a dopant, but is not limited thereto.

For example, the dopant may be included in an amount of 5 wt % or less with respect to a total weight of the second low-reflective material, but is not limited thereto.

For example, the second low-reflective material may be a combination of Mo, $In_2O_3$ and $SnO_2$. In this case, if necessary, it may further include at least one selected from ZnO and $MoO_2$ as a dopant. In this case, it is possible to decrease the reflectance while maintaining high electrical characteristics of the conductive layer.

For example, the third low-reflective material may be formed of a fourth metal oxide and two or more different conductive oxides.

For example, the fourth metal oxide may be at least one selected from among $MoO_3$, $MoO_2$ and $WO_3$.

For example, the conductive oxides may be two or more selected from among $In_2O_3$, $SnO_2$ and ZnO.

For example, the third low-reflective material may include 50 wt % to 70 wt % of the fourth metal oxide and 30 wt % to 50 wt % of the conductive oxides. Within this range, the reflectance may be reduced while maintaining high electrical characteristics of the conductive layer.

Optionally, the third low-reflective material may further include a dopant as needed. For example, the third low-reflective material may further include molybdenum (Mo) as a dopant, but is not limited thereto.

For example, the dopant may be included in an amount of 5 wt % or less with respect to a total weight of the third low-reflective material, but is not limited thereto.

For example, the third low-reflective material may be a combination of $MoO_2$, $In_2O_3$ and $SnO_2$. In this case, if necessary, the third low-reflective material may further include at least one selected from ZnO and Mo as a dopant. In this case, the reflectance may be reduced while maintaining high electrical characteristics of the conductive layer.

For example, a thickness of the first sub-conductive layer of each of the first conductive layer and the second conductive layer may be 300 Å to 700 Å, 300 Å to 600 Å, 300 Å to 500 Å, 400 Å to 500 Å, or 450 Å to 600 Å. When the thickness of the first sub-conductive layer is within the above range, the reflectance may be further reduced. When the thickness is less than 300 Å, the reflectance in a long-wavelength band may increase, and when the thickness exceeds 700 Å, the reflectance in a short-wavelength band may increase.

The thickness of the first sub-conductive layer of each of the first conductive layer and the second conductive layer may vary depending on a material.

For example, when the first sub-conductive layer of each of the first conductive layer and the second conductive layer is formed of the first low-reflective material, if the thickness exceeds 600 Å, a reflectance in a short-wavelength band increases and thus, an effect of reducing the reflectance may be insignificant. Preferably, when the first sub-conductive layer is formed of the first low-reflective material, the thickness of the first sub-conductive layer may be 400 Å to 500 Å, 350 Å to 450 Å, 360 Å to 440 Å, or 370 Å to 420 Å. In this case, there is an advantage in that a reflectance in a wavelength of 380 nm to 740 nm is excellent. As another example, when considering a reflectance in a wavelength of 550 nm, the thickness of the first sub-conductive layer formed of the first low-reflective material may be 310 Å to 350 Å.

For example, when the first sub-conductive layer is formed of the second low-reflective material or the third low-reflective material, if the thickness exceeds 700 Å, a reflectance in a short-wavelength band increases and thus, an effect of reducing the reflectance may be insignificant. Preferably, the thickness of the first sub-conductive layer formed of the second low-reflective material or the third low-reflective material may be 450 Å to 600 Å or 500 Å to 600 Å, and within this range, the reflectance may be further reduced.

For example, a refractive index (n) of the first sub-conductive layer of each of the first conductive layer and the second conductive layer may be 2.1 to 2.9, 2.3 to 2.9, or 2.3 to 2.7. The reflectance can be minimized within this range, and when the refractive index exceeds 2.9, the reflectance in a short-wavelength band may increase.

For example, an extinction coefficient (k) of the first sub-conductive layer of each of the first conductive layer and the second conductive layer may be 0.6 to 1.2, preferably 0.8 to 1.0. Within this range, a reflectance can be minimized. If the extinction coefficient is less than 0.6, since absorption in a long-wavelength band decreases, an image may be displayed in a reddish color when the first conductive layer and the second conductive layer are applied as components of a thin film transistor and a light blocking layer. In addition, when the extinction coefficient is greater than 1.2, a reflectance may increase and thus, visibility may be lowered.

The refractive index and the extinction coefficient may be adjusted according to a composition of the low-reflective material. Taking the first low-reflective material formed of a combination of Mo, MoOx($MoO_2$+$MoO_3$), $Nb_2O_5$, and ZnO as an example, the refractive index and extinction coefficient tend to increase as a relative ratio of Mo increases. Specifically, when the ratio of Mo is 0, the refractive index is 2.6 and the extinction coefficient is 0.7. However, when the ratio of Mo is 15 wt %, the refractive index may be 2.8 and the extinction coefficient may be 1.2, and when the ratio of Mo is 23 wt %, the refractive index may be 2.9 and the extinction coefficient may be 1.4. When the ratio of Mo is 0, the refractive index and the extinction coefficient fall within the above-described ranges, but the electrical characteristics of the conductive layer may be degraded. Accordingly, the composition of the low-reflective material should be adjusted within a range in which electrical characteristics of the conductive layer are not degraded so that the refractive index and the extinction coefficient are within the above ranges. Accordingly, the electrical characteristics and visibility can be simultaneously satisfied.

As described above, the first conductive layer and the second conductive layer may be components of a thin film transistor, a light blocking layer and the like. Hereinafter, an exemplary embodiment of the present disclosure in which the first conductive layer is a gate electrode of the thin film transistor and the second conductive layer is a source electrode and a drain electrode of the thin film transistor will be described with reference to FIGS. 1 to 3.

Figure 2:
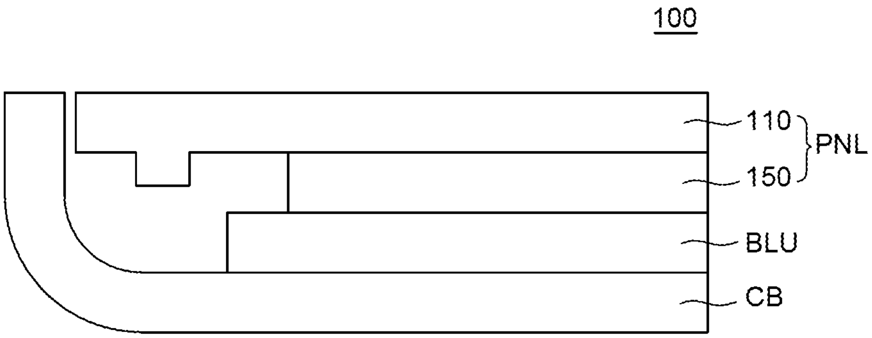
FIG. 2 is a schematic cross-sectional view of the display device according to an exemplary embodiment of the present disclosure.
Figure 3:
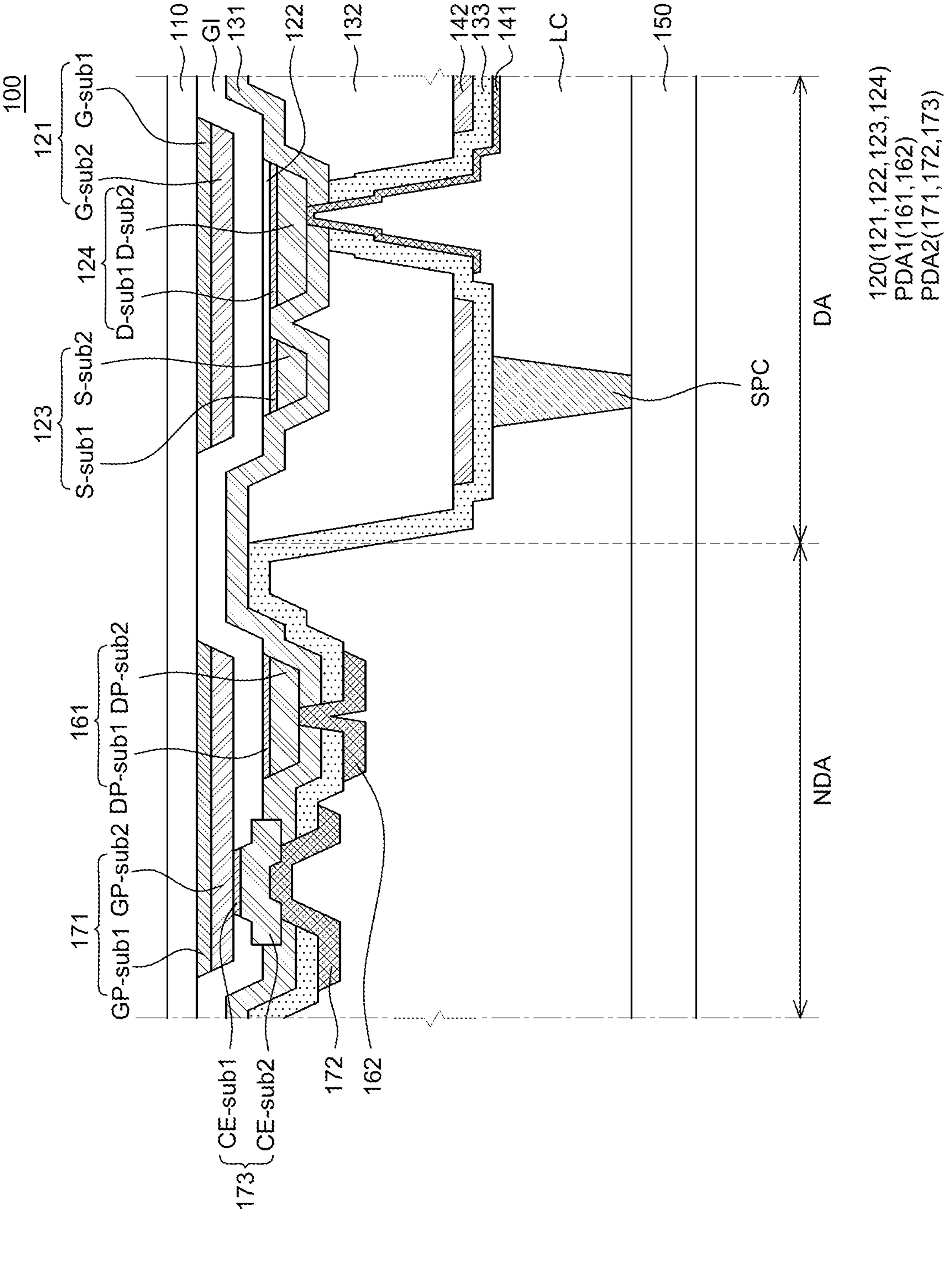
FIG. 3 is a schematic cross-sectional view illustrating a liquid crystal display panel of the display device according to an exemplary embodiment of the present disclosure.

FIGS. 1 to 3 are views for explaining a display device according to an exemplary embodiment of the present disclosure. For example, the display device may be a liquid crystal display device including a liquid crystal layer, and as another example, the display device may be an organic light emitting display device including an organic light emitting layer. Hereinafter, a liquid crystal display device is described as an example for convenience of explanation, but the display device of the present disclosure is not limited to the liquid crystal display device.

FIG. 1 is a schematic plan view of a display device according to an exemplary embodiment of the present disclosure. In FIG. 1, only a first substrate 110 and a plurality of sub-pixels SP among various components of a display device 100 are illustrated for convenience of description.

The first substrate 110 is a component to support various components included in the display device 100 and to protect them from external impacts or an external environment, and the first substrate 110 may be formed of an insulating material. For example, the first substrate 110 may be formed of a glass substrate or a plastic substrate such as polyethylene terephthalate (PET), polyethylene naphthalate (PEN), or polyimide.

The first substrate 110 supports various components of the display device 100. The first substrate 110 includes a display area DA and a non-display area NDA. The display area DA is an area where the plurality of sub-pixels SP are disposed, and is an area where an actual image is displayed. The non-display area NDA is an outer area surrounding the display area DA, and is an area where no image is displayed. The non-display area NDA may be referred to as a bezel area. Lines and driving circuits for driving a screen are disposed in the non-display area NDA.

The plurality of sub-pixels SP may be defined on the first substrate 110. The plurality of sub-pixels SP are minimum units constituting the display area DA, and are each an area for displaying one color. For example, the plurality of sub-pixels SP may include a red sub-pixel, a green sub-pixel, and a blue sub-pixel. The plurality of sub-pixels SP may be defined in a matrix form as shown in FIG. 1.

FIG. 2 is a schematic cross-sectional view of the display device according to an exemplary embodiment of the present disclosure. FIG. 2 is a cross-sectional view showing a part of a structure of a borderless display device as the display device 100 illustrated in FIG. 1.

Referring to FIG. 2, the display device 100 according to the present disclosure includes a liquid crystal display panel PNL including the first substrate 110 and a second substrate 150, a backlight unit BLU, and a cover bottom CB.

The liquid crystal display panel PNL display an image by pixels that are arranged in a matrix form, and includes the first substrate 110 and the second substrate 150 that are bonded with a liquid crystal layer LC interposed therebetween to control light transmittance.

The display device 100 according to an exemplary embodiment of the present disclosure is a borderless liquid crystal display device, and the first substrate 110 that is an upper substrate is configured as a thin film transistor array substrate and the second substrate 150 that is a lower substrate is configured as a color filter substrate. That is, in the display device 100 according to an exemplary embodiment of the present disclosure, the liquid crystal display panel PNL is turned over so that the thin film transistor array substrate having a relatively large area is positioned above the color filter substrate, unlike an existing case. Accordingly, since pad unit components formed on the thin film transistor array substrate positioned above are disposed toward a rear side of the liquid crystal display panel PNL, it is possible to delete equipment (meaning "not present") such as an external cover (or top case) for covering the pad unit components, so that a four-sided borderless type display device can be implemented. In this case, as described above, a structure in which the thin film transistor array substrate is positioned above and used as a viewing surface may be referred to as a flip-over type.

The backlight unit BLU is disposed below the liquid crystal display panel PNL and supplies light to the liquid crystal display panel PNL. The backlight unit BLU may include a light source, a reflective film, a light guide plate, a guide panel, an optical film, and the like. In this case, as the light source, the backlight unit BLU may select and use any one of a cold cathode fluorescence lamp (CCFL), a hot cathode fluorescence lamp (HCFL), an external electrode fluorescence lamp (EEFL), or a light emitting diode (LED), but the present disclosure is not limited thereto.

The cover bottom CB is a case member that accommodates and protects components of the display device 100. The cover bottom CB may surround side surfaces of the liquid crystal display panel PNL and the backlight unit BLU, and may be disposed on a rear surface of the backlight unit BLU. Specifically, the cover bottom CB may be formed in a quadrangular frame shape in which an edge thereof is vertically bent. For example, the cover bottom CB may include a horizontal portion that is disposed to face the back surface of the backlight unit BLU and a vertical portion extending from the horizontal portion to cover the side surfaces of the liquid crystal display panel PNL and the backlight unit BLU.

The cover bottom CB may include a material having high thermal conductivity and high rigidity to smoothly dissipate heat from the driving circuit and the light source of the backlight unit BLU to the outside. For example, the cover bottom CB may be manufactured as a metal plate such as aluminum, aluminum nitride (AlN), electro-galvanized iron (EGI), stainless (SUS), galvalume (SGLC), aluminum-coated steel (also known as ALCOSTA), tin-plated steel (SPTE) or the like, but present disclosure is not limited thereto.

Also, although not shown in FIG. 2, a polarizing plate may be disposed on at least one of a front surface and a rear surface of the display panel PNL. For example, the polarizing plate may be disposed on a surface of the first substrate 110 that is opposite to a surface thereof on which a thin film transistor 120 is disposed, but the present disclosure is not limited thereto.

Hereinafter, the liquid crystal display panel PNL of the display device 100 according to an exemplary embodiment of the present disclosure will be described with reference to FIG. 3. FIG. 3 is a schematic cross-sectional view illustrating a liquid crystal display panel of the display device according to an exemplary embodiment of the present disclosure.

For example, the liquid crystal display panel PNL may be driven in a fringe field switching (FFS) method in which a fringe field formed between a first electrode 141 that is a pixel electrode and a second electrode 142 that is a common electrode, penetrates a slit and drives liquid crystal molecules of the liquid crystal layer LC positioned on a pixel area to implement an image. As another example, the liquid crystal display panel PNL may be driven in an in-plane switching (IPS) method in which the first electrode 141 that is the pixel electrode and the second electrode 142 that is the common electrode are disposed in parallel and the liquid crystal molecules of the liquid crystal layer LC are driven by a horizontal field of the first electrode 141 and the second electrode 142 to display an image.

Referring to FIG. 3, the liquid crystal display panel PNL includes the first substrate 110 and the second substrate 150.

The thin film transistor 120 and various lines and electrodes are formed on the first substrate 110 to define the plurality of sub-pixels. Color filters for displaying three primary colors of red, green, and blue and a black matrix between the respective sub-pixels may be formed on the second substrate 150. As described in FIG. 2, the first substrate 110 including the thin film transistor 120, having a relatively large area is positioned above the second substrate 150 including the color filters, so that the display device 100 of a borderless type can be implemented.

A plurality of gate lines and data lines are disposed to intersect each other on the first substrate 110. The thin film transistor 120 is disposed in an intersection area of the gate line and the data line, and is connected to the first electrode 141 formed in the display area DA.

The thin film transistor 120 is disposed on the first substrate 110. Although FIG. 3 illustrates the thin film transistor 120 having a back-channel etch (BCE) structure, this is only an example and present disclosure is not limited thereto.

A buffer layer may be disposed between the first substrate 110 and the thin film transistor 120. The buffer layer blocks impurities introduced from the first substrate 110 during a process of forming a thin film transistor. In addition, the buffer layer protects various components of the display device 100 by preventing penetration of moisture ($H_2O$) and hydrogen ($H_2$) from the outside. The buffer layer may be formed of an insulating material, and for example, the buffer layer may be formed as single layer or multilayer of an inorganic layer formed of silicon nitride (SiNx), silicon oxide (SiOx), or silicon oxynitride (SiON).

The thin film transistor 120 may be used as a driving element of the display device 100. The thin film transistor 120 includes a gate electrode 121, an active layer 122, a source electrode 123 and a drain electrode 124.

Specifically, the gate electrode 121 that branches from the gate line is disposed on the first substrate 110.

The gate electrode 121 may be formed of a plurality of layers, and for example, the gate electrode 121 may be formed of a double layer including a first sub-conductive layer G-sub1 and a second sub-conductive layer G-sub2. As described above, in the exemplary embodiment, the gate electrode 121 is identical to the first conductive layer. Accordingly, the first sub-conductive layer G-sub1 of the gate electrode 121 has identical characteristics as those of the first sub-conductive layer of the first conductive layer described above, and the second sub-conductive layer G-sub2 of the gate electrode 121 has identical characteristics as those of the second sub-conductive layer of the first conductive layer described above. Accordingly, duplicate descriptions of the first sub-conductive layer G-sub1 and the second sub-conductive layer G-sub2 of the gate electrode 121 will be omitted.

For example, the first sub-conductive layer G-sub1 of the gate electrode 121 may be formed of at least one selected from among the above-described first low-reflective material, second low-reflective material, and third low-reflective material. Preferably, the first sub-conductive layer G-sub1 of the gate electrode 121 may be the first low-reflective material and more preferably, it may be the first low-reflective material including Mo, $MoO_2$, $MoO_3$, $Nb_2O_5$, and ZnO. In this case, a reflectance is reduced while maintaining high electrical characteristics of the gate electrode 121, so that visibility can be improved.

A gate insulating layer GI is disposed on the gate electrode 121. The gate insulating layer GI is a layer for insulating the gate electrode 121 and the active layer 122 and may be formed of an insulating material. For example, the gate insulating layer GI may be composed of a single layer or multiple layers of silicon oxide (SiOx) or silicon nitride (SiNx), but is not limited thereto.

The active layer 122 is disposed on the gate electrode 121 to overlap the gate electrode 121 with the gate insulating layer GI interposed therebetween. The active layer 122 may be formed of, for example, amorphous silicon, polycrystalline silicon, an oxide semiconductor, or an organic semiconductor, but is not limited thereto.

The source electrode 123 and the drain electrode 124 are disposed on the active layer 122. The source electrode 123 and the drain electrode 124 are disposed on the same layer to be spaced apart from each other. The source electrode 123 may be disposed to contact one end of the active layer 122 and the drain electrode 124 may be disposed to contact the other end of the active layer 122. In this case, the source electrode 123 and the drain electrode 124 may be respectively disposed to directly contact the active layer 122, or may contact the active layer 122 through a connection pattern.

Each of the source electrode 123 and the drain electrode 124 is formed of a plurality of layers. For example, the source electrode 123 may be formed of a double layer including a first sub-conductive layer S-sub1 and a second sub-conductive layer S-sub2. For example, the drain electrode 124 may be formed of a double layer including a first sub-conductive layer D-sub1 and a second sub-conductive layer D-sub2. As described above, in the exemplary embodiment, the source electrode 123 and the drain electrode 124 are identical to the second conductive layer. Accordingly, the respective first sub-conductive layers S-sub1 and D-sub1 of the source electrode 123 and the drain electrode 124 have identical characteristics as those of the first sub-conductive layer of the second conductive layer described above. The respective second sub-conductive layers S-sub2 and D-sub2 of the source electrode 123 and the drain electrode 124 have identical characteristics as those of the second sub-conductive layer of the second conductive layer described above. Accordingly, duplicate descriptions of the first sub-conductive layer S-sub1 and the second sub-conductive layer S-sub2 of the source electrode 123 and the first sub-conductive layer D-sub1 and the second sub-conductive layer D-sub2 of the drain electrode 124 will be omitted.

For example, each of the first sub-conductive layer S-sub1 of the source electrode 123 and the first sub-conductive layer D-sub1 of the drain electrode 124 may be formed of the second low-reflective material or the third low-reflective material.

When the first sub-conductive layer S-sub1 of the source electrode 123 and the first sub-conductive layer D-sub1 of the drain electrode 124 are formed of the first low-reflective material, contact resistance between the active layer 122 and the source electrode 123 and the drain electrode 124 increases, so that performance of the thin film transistor 120 may be degraded. Accordingly, the first sub-conductive layers S-sub1 and D-sub1 of the source electrode 123 and the drain electrode 124 may be formed of the second low-reflective material or third low-reflective material which is capable of maintaining a low contact resistance with the active layer 122.

For example, specific resistance of the first sub-conductive layer G-sub1 of the gate electrode 121 that is formed of the first low-reflective material may be $1\times10^{-2}\Omega$ to $6\times10^{-2}\Omega$, and specific resistance of each of the first sub-conductive layers S-sub1 and D-sub1 of the source electrode 123 and the drain electrode 124 formed of the second low-reflective material or the third low-reflective material may be $1\times10^{-3}\Omega$ to $6\times10^{-3}\Omega$, but the present disclosure is not limited thereto.

Preferably, the first sub-conductive layer G-sub1 of the gate electrode 121 may be formed of the first low-reflective material, and the respective first sub-conductive layers S-sub1 and D-sub1 of the source electrode 123 and the drain electrode 124 may be formed of the second low-reflective material or third low-reflective material. In this case, the resistance of each of the first sub-conductive layers S-sub1 and D-sub1 of the source electrode 123 and the drain electrode 124 is smaller than the resistance of the first sub-conductive layer G-sub1 of the gate electrode 121. Accordingly, the contact resistance between the active layer 122 and the source electrode 123 and the drain electrode 124 is kept low, so that a reflectance of the display device 100 is reduced without degrading the performance of the thin film transistor 120 and thus, visibility can be greatly improved.

A passivation layer 131 is disposed on the source electrode 123 and the drain electrode 124. The passivation layer 131 is an insulating layer for protecting components under the passivation layer 131. The passivation layer 131 may be composed of a single layer or multiple layers of silicon oxide (SiOx) or silicon nitride (SiNx), but is not limited thereto.

A planarization layer 132 is disposed on the passivation layer 131. The planarization layer 132 is an insulating layer that planarizes an upper portion of the first substrate 110 on which the thin film transistor 120 is disposed. The planarization layer 132 may be formed of an organic material, and may be composed of, for example, a single layer or multiple layers of polyimide or photoacryl, but present disclosure is not limited thereto. The planarization layer 132 may include a contact hole for electrically connecting the thin film transistor 120 and the first electrode 141.

The second electrode 142 which is a common electrode is formed on the planarization layer 132. The second electrode 142 is electrically connected to a common line. The second electrode 142 is composed of one large electrode and is commonly used by the sub-pixels SP. In some embodiments, the second electrode 142 may be composed of a plurality of common electrode blocks. In this case, the common electrode blocks may function as touch electrodes of a capacitive type touch element, and the display device 100 may be implemented as a display device in which the touch element is embedded.

For example, the second electrode 142 may be formed of a transparent conductive material. For example, the transparent conductive material may include tin oxide (TO), indium tin oxide (ITO), indium zinc oxide (IZO), indium tin zinc oxide (ITZO), or the like, but is not limited thereto.

A protective layer 133 is disposed on the second electrode 142. The protective layer 133 is a layer for insulating the second electrode 142 and the first electrode 141, and may be formed of an inorganic insulating material or an organic insulating material. For example, the protective layer 133 may be composed of a single layer or multiple layers of silicon oxide (SiOx) or silicon nitride (SiNx), but is not limited thereto.

The first electrode 141 is disposed on the protective layer 133. The first electrode 141 is electrically connected to the drain electrode 124 through contact holes penetrating the protective layer 133, the planarization layer 132, and the passivation layer 131. In FIG. 3, the first electrode 141 is shown as being in contact with the drain electrode 124 of the thin film transistor 120, but in some embodiments, the first electrode 141 may contact the source electrode 123 of the thin film transistor 120.

For example, the first electrode 141 may be formed of a transparent conductive material. For example, the transparent conductive material may include tin oxide (TO), indium tin oxide (ITO), indium zinc oxide (IZO), indium tin zinc oxide (ITZO) and the like, but is not limited thereto.

When a voltage is applied to the first electrode 141 through the thin film transistor 120, the liquid crystal molecules of the liquid crystal layer LC rotates due to dielectric anisotropy by an electric field formed on the first electrode 141 and the second electrode 142. A transmittance of light penetrating the display area is changed according to a degree of rotation of liquid crystals. Accordingly, the amount of light emission of the sub-pixel SP may be controlled.

The second substrate 150 is disposed to face the first substrate 110. The second substrate 150 is a component for supporting components disposed on the substrate and may be formed of an insulating material. For example, the second substrate 150 may be formed of a glass substrate or a plastic substrate such as polyethylene terephthalate (PET), polyethylene naphthalate (PEN), or polyimide.

The second substrate 150 is a substrate including a color filter layer and the black matrix. The black matrix may be disposed on the second substrate 150 to overlap the thin film transistor 120, the gate lines, and the data lines of the first substrate 110. The black matrix may be formed of an opaque organic material, and may include, for example, black resin. The thin film transistor 120, the gate lines, and the data lines may be covered by the black matrix. An area where the black matrix is not disposed is an opening area and corresponds to an area of the sub-pixel SP through which light is transmitted. The color filter layer includes a plurality of color filters that transmit light of different wavelengths. The color filters may be composed of, for example, red, green and blue color filters including red, green and blue pigments. Red, green, and blue colors can be expressed by absorbing or transmitting light of specific wavelengths using the color filters.

A spacer SPC is disposed between the first substrate 110 and the second substrate 150 to maintain a gap between the first substrate 110 and the second substrate 150. The liquid crystal layer LC is disposed in the gap between the first substrate 110 and the second substrate 150 formed by the spacer SPC. The liquid crystal layer LC is a layer including liquid crystals and capable of transmitting or blocking light by an electric field. Specifically, the liquid crystal layer LC changes light transmittance by an electric field generated by the first electrode 141 and the second electrode 142 to display an image.

A plurality of pad units PAD1 and PAD2 are disposed on the first substrate 110 corresponding to the non-display area NDA. For example, a first pad unit PAD1 and a second pad unit PAD2 are disposed on the first substrate 110 corresponding to the non-display area NDA. The first pad unit PAD1 is disposed on the first substrate 110 to correspond to the non-display area NDA adjacent to the display area DA. The second pad unit PAD2 is disposed outside the first pad unit PAD1 to be adjacent to the first pad unit PAD1.

For example, the first pad unit PAD1 may be a data pad unit. The first pad unit PAD1 includes a first data pad electrode 161 and a second data pad electrode 162. The first data pad electrode 161 is disposed on the gate insulating layer GI. The first data pad electrode 161 may be formed through the same process as the source electrode 123 and the drain electrode 124. Accordingly, the first data pad electrode 161 is formed of the same material as the source electrode 123 and the drain electrode 124. As described above, in the exemplary embodiment, the second conductive layer is the source electrode 123 and the drain electrode 124. Accordingly, the first data pad electrode 161 formed of the same material through the same process as the source electrode 123 and the drain electrode 124 also has identical characteristics as those of the above-described second conductive layer.

For example, the first data pad electrode 161 includes a first sub-conductive layer DP-sub1 and a second sub-conductive layer DP-sub2. The first sub-conductive layer DP-sub1 of the first data pad electrode 161 has identical characteristics as those of the first sub-conductive layers S-sub1 and D-sub1 of the source electrode 123 and the drain electrode 124, and the second sub-conductive layer DP-sub2 of the first data pad electrode 161 has identical characteristics as those of the second sub-conductive layers S-sub2 and D-sub2 of the source electrode 123 and the drain electrode 124. Accordingly, duplicate descriptions of the first sub-conductive layer DP-sub1 and the second sub-conductive layer DP-sub2 of the first data pad electrode 161 will be omitted.

In an exemplary embodiment of the present disclosure, since the first sub-conductive layer DP-sub1 of the first data pad electrode 161 is formed of the second low-reflective material or third low-reflective material described above, a reflectance can be further reduced and thus, visibility of the display device 100 can be further improved.

The second data pad electrode 162 is disposed on the first data pad electrode 161. The second data pad electrode 162 is disposed on the protective layer 133 to be in contact with the first data pad electrode 161 that is exposed through contact holes penetrating the passivation layer 131 and the protective layer 133. The second data pad electrode 162 may be formed through the same process as the first electrode 141, which is the pixel electrode. Accordingly, the second data pad electrode 162 is formed of the same material as the first electrode 141.

For example, the second pad unit PAD2 may be a gate pad unit. The second pad unit PAD2 includes a first gate pad electrode 171, a gate pad connection electrode 173, and a second gate pad electrode 172.

The first gate pad electrode 171 is disposed on the first substrate 110. The first gate pad electrode 171 may be formed through the same process as the gate electrode 121. Accordingly, the first gate pad electrode 171 is formed of the same material as the gate electrode 121. As described above, in the exemplary embodiment, the first conductive layer is the gate electrode 121. Accordingly, the first gate pad electrode 171 formed of the same material through the same process as the gate electrode 121 also has identical characteristics as those of the first conductive layer described above.

For example, the first gate pad electrode 171 includes a first sub-conductive layer GP-sub1 and a second sub-conductive layer GP-sub2. The first sub-conductive layer GP-sub1 of the first gate pad electrode 171 has identical characteristics as those of the first sub-conductive layer G-sub1 of the gate electrode 121, and the second sub-conductive layer GP-sub2 of the first gate pad electrode 171 has identical characteristics as those of the second sub-conductive layer G-sub2 of the gate electrode 121. Accordingly, duplicate descriptions of the first sub-conductive layer GP-sub1 and the second sub-conductive layer GP-sub2 of the first gate pad electrode 171 will be omitted.

In an exemplary embodiment of the present disclosure, since the first sub-conductive layer GP-sub1 of the first gate pad electrode 171 includes at least one of the first low-reflective material, the second low-reflective material, and the third low-reflective material described above, a reflectance can be further reduced and thus, visibility of the display device 100 can be further improved.

The gate pad connection electrode 173 is disposed on the first gate pad electrode 171. The gate pad connection electrode 173 is disposed on the gate insulating layer GI to contact the first gate pad electrode 171 that is exposed by a contact hole penetrating the gate insulating layer GI.

The gate pad connection electrode 173 may be formed through the same process as the source electrode 123, the drain electrode 124, and the first data pad electrode 161. That is, the gate pad connection electrode 173 is formed of the same material as the source electrode 123, the drain electrode 124, and the first data pad electrode 161.

The gate pad connection electrode 173 includes a first sub-conductive layer CE-sub1 and a second sub-conductive layer CE-sub1. The first sub-conductive layer CE-sub1 of the gate pad connection electrode 173 has identical characteristics as those of the source electrode 123, the drain electrode 124, and the first sub-conductive layer DP-sub1 of the first data pad electrode 161. The second sub-conductive layer CE-sub2 of the gate pad connection electrode 173 has identical characteristics as those of the source electrode 123, the drain electrode 124, and the second sub-conductive layer DP-sub2 of the first data pad electrode 161. Accordingly, duplicate descriptions of the first sub-conductive layer CE-sub1 and the second sub-conductive layer CE-sub2 of the gate pad connection electrode 173 will be omitted.

In an exemplary embodiment of the present disclosure, since the first sub-conductive layer CE-sub1 of the gate pad connection electrode 173 includes at least one of the second low-reflective material and the third low-reflective material described above, a reflectance can be further reduced and thus, visibility of the display device 100 can be further improved.

FIG. 3 shows that the gate pad connection electrode 173 is included, in some embodiments, the gate pad connection electrode 173 may be omitted. When the gate pad connection electrode 173 is not included, contact holes should be formed to pass through the gate insulating layer GI, the passivation layer 131 and the protective 133 so that the first gate pad electrode 171 and the second gate pad electrode 172 come into contact with each other. In a process of forming the contact holes penetrating the three layers as described above, peripheral components may be damaged and process efficiency may be reduced. However, if a defect in the process as described above is not caused depending on designs of the thin film transistor and the pad unit, the gate pad connection electrode 173 may be omitted.

The second gate pad electrode 172 is disposed on the gate pad connection electrode 173. The second gate pad electrode 172 is disposed on the protective layer 133 to be in contact with the gate pad connection electrode 173 that is exposed by contact holes penetrating the passivation layer 131 and the protective layer 133.

The second gate pad electrode 172 may be formed through the same process as the first electrode 141 that is the pixel electrode. Accordingly, the second gate pad electrode 172 is formed of the same material as the first electrode 141.

Although FIG. 3 shows only the first pad unit PAD1 as the data pad unit and the second pad unit PAD2 as the gate pad unit, a touch pad unit may be further included, and pad electrodes constituting the pad units may include a layer formed of the first low-reflective material, the second low-reflective material, or the third low-reflective material described above.

In the display device 100 according to an exemplary embodiment of the present disclosure, the gate electrode 121 and the first gate pad electrode 171 include the first sub-conductive layers G-sub1 and GP-sub1, respectively, that are formed of at least one of the first low-reflective material, the second low-reflective material, and the third low-reflective material described above. In addition, the source electrode 123, the drain electrode 124, the first data pad electrode 161, and the gate pad connection electrode 173 include the first sub-conductive layers S-sub1, D-sub1, DP-sub1, and CE-sub1, respectively, that are formed of one of the second low-reflective material and the third low-reflective material. Accordingly, reflectivity due to metal layers having high reflectances is minimized, and thus, visibility can be greatly improved.

As described above, in another exemplary embodiment of the present disclosure, the first conductive layer may be a light blocking layer, and the second conductive layer may be a gate electrode, a source electrode, and a drain electrode. Hereinafter, another exemplary embodiment of the present disclosure in which the first conductive layer is the light blocking layer and the second conductive layer is the gate electrode, the source electrode, and the drain electrode will be described with reference to FIG. 4.

Figure 4:
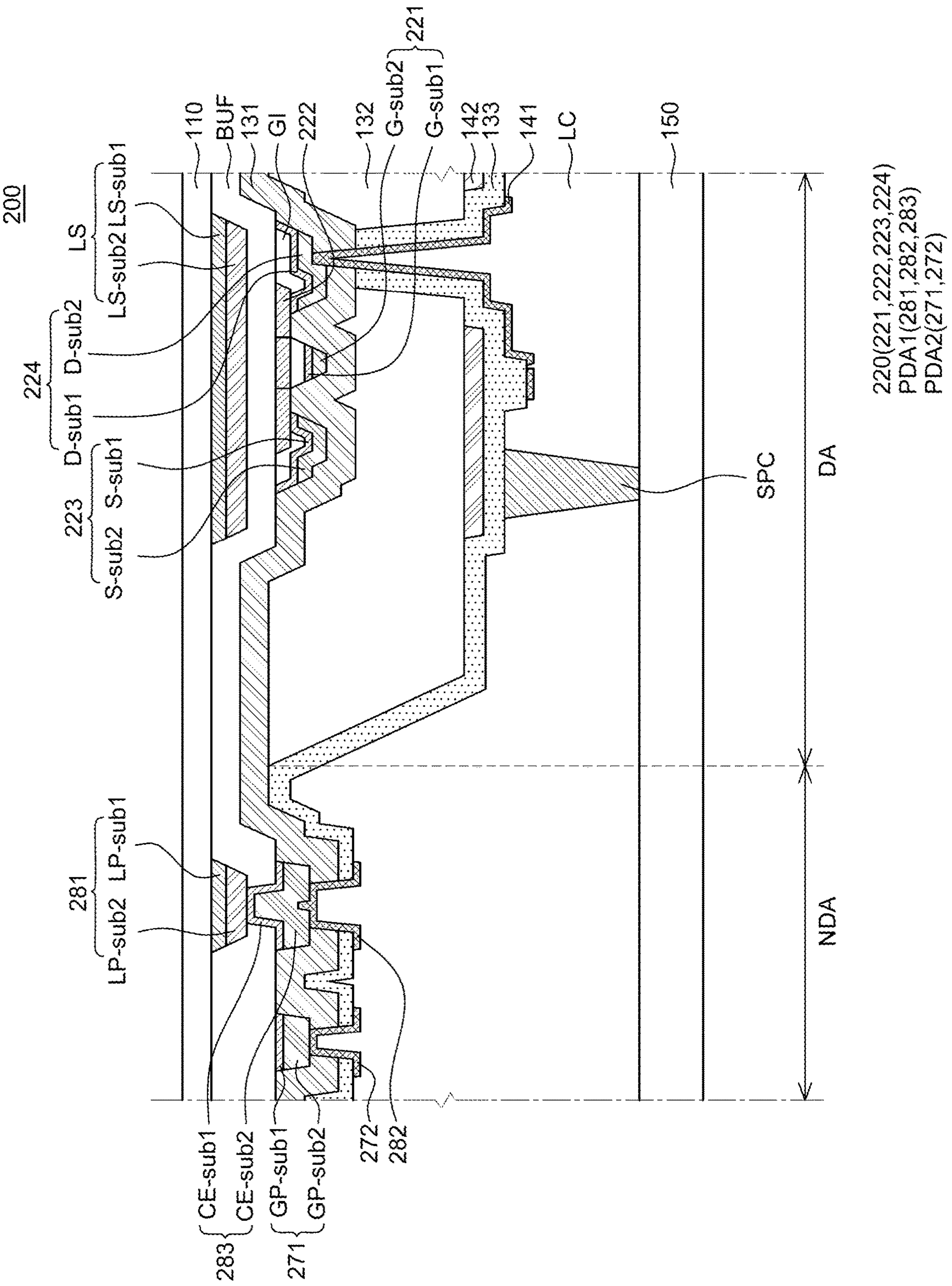
FIG. 4 is a schematic cross-sectional view illustrating a liquid crystal display panel of a display device according to another exemplary embodiment of the present disclosure.

FIG. 4 is a schematic cross-sectional view illustrating a liquid crystal display panel of a display device according to another exemplary embodiment of the present disclosure. In the exemplary embodiment, for convenience of explanation, the display device is described as a liquid crystal display device by way of example, but the display device of the present disclosure is not limited to the liquid crystal display device. In addition, other configurations of a display device 200 according to the exemplary embodiment shown in FIG. 4 are identical to those of the display device 100 according to the exemplary embodiment illustrated in FIGS. 1 to 3 except for the liquid crystal display panel PNL. Accordingly, duplicate descriptions will be omitted.

Referring to FIG. 4, a light blocking layer LS is disposed on the first substrate 110. The light blocking layer LS is disposed to prevent damage to a thin film transistor 220, particularly, damage to an active layer 222, by blocking light such as ultraviolet light incident from the outside of the display device. Accordingly, the light blocking layer LS is disposed to overlap the thin film transistor 220.

The thin film transistor 120 shown in FIG. 3 has a structure in which the gate electrode 121 is disposed on the first substrate 110 and the active layer 122 is disposed on the gate electrode 121. Unlike this, the thin film transistor 220 shown in FIG. 4 is a thin film transistor of a co-planar structure in which a gate electrode 221 is disposed on the active layer 222. Accordingly, the active layer 222 may be damaged by ultraviolet light incident from the first substrate 110. The light blocking layer LS is disposed between the first substrate 110 and the active layer 222 to prevent damage to the active layer 222 by ultraviolet light.

The light blocking layer LS is formed of a plurality of layers, and for example, the light blocking layer LS may be formed of a double layer including a first sub-conductive layer LS-sub1 and a second sub-conductive layer LS-sub2. As described above, in the exemplary embodiment, the light blocking layer LS is identical to the first conductive layer. Accordingly, the first sub-conductive layer LS-sub1 of the light blocking layer LS has identical characteristics as those of the first sub-conductive layer of the first conductive layer described above, and the second sub-conductive layer LS-sub2 of the light blocking layer LS has identical characteristics as those of the second sub-conductive layer of the first conductive layer described above. Accordingly, the first sub-conductive layer LS-sub1 and the second sub-conductive layer LS-sub2 of the light blocking layer LS are identical to the first sub-conductive layer and the second sub-conductive layer of the first conductive layer described above. Therefore, duplicate explanations will be omitted.

For example, the first sub-conductive layer LS-sub1 of the light blocking layer LS may be formed of at least one selected from among the above-described first low-reflective material, second low-reflective material, and third low-reflective material. Preferably, the first sub-conductive layer LS-sub1 of the light blocking layer LS may be the first low-reflective material. The first low-reflective material has a relatively superior effect of reducing a reflectance compared to the second low-reflective material and the third low-reflective material, so that visibility may be further improved. More preferably, the first sub-conductive layer LS-sub1 of the light blocking layer LS may be the first low-reflective material including Mo, $MoO_2$, $MoO_3$, $Nb_2O_5$, and ZnO. In this case, while minimizing damage to the active layer 222 by light, the reflectance is reduced, so that visibility can be improved.

A buffer layer BUF is disposed on the light blocking layer LS. The buffer layer BUF insulates the light blocking layer LS and the thin film transistor 220. In addition, the buffer layer BUF blocks impurities introduced from the first substrate 110 and the light blocking layer LS during a process of forming a thin film transistor and prevents damage to the light blocking layer LS. The buffer layer BUF may be formed of an insulating material, and for example, the buffer layer BUF may be formed as single layer or multilayer of an inorganic layer formed of silicon nitride (SiNx), silicon oxide (SiOx), or silicon oxynitride (SiON).

The thin film transistor 220 is disposed on the buffer layer BUF. The thin film transistor 220 includes the active layer 222, the gate electrode 221, a source electrode 223 and a drain electrode 224.

The active layer 222 is disposed on the buffer layer BUF to correspond to the light blocking layer LS. For example, the active layer 222 may be formed of amorphous silicon, polycrystalline silicon, an oxide semiconductor, or an organic semiconductor, but is not limited thereto.

The gate insulating layer GI is disposed on the active layer 222. The gate insulating layer GI is a layer for insulating the active layer 222 and the gate electrode 221 and may be disposed to overlap a channel region of the active layer 222. The active layer 222 may be formed of an insulating material. For example, the gate insulating layer GI may be composed of a single layer or multiple layers of silicon oxide (SiOx) or silicon nitride (SiNx), but is not limited thereto.

The gate electrode 221 is disposed on the gate insulating layer GI. The gate electrode 221 is composed of a plurality of layers. For example, the gate electrode 221 may be formed of a double layer including the first sub-conductive layer G-sub1 and the second sub-conductive layer G-sub2. As described above, in the exemplary embodiment, the gate electrode 221 is identical to the second conductive layer. Accordingly, the first sub-conductive layer G-sub1 of the gate electrode 221 has identical characteristics as those of the first sub-conductive layer of the second conductive layer described above, and the second sub-conductive layer G-sub2 of the gate electrode 221 has identical characteristics as those of the second sub-conductive layer of the second conductive layer described above. Accordingly, the first sub-conductive layer G-sub1 and the second sub-conductive layer G-sub2 of the gate electrode 221 are identical to the first sub-conductive layer and the second sub-conductive layer of the second conductive layer described above. Therefore, duplicate explanations will be omitted.

For example, the first sub-conductive layer G-sub1 of the gate electrode 221 may be formed of at least one selected from among the above-described second low-reflective material and third low-reflective material. Preferably, the first sub-conductive layer G-sub1 of the gate electrode 221 may be the second low-reflective material formed of a combination of Mo, $In_2O_3$ and $SnO_2$ or the third low-reflective material formed of a combination of $MoO_2$, $In_2O_3$ and $SnO_2$. In this case, the second low-reflective material may further include at least one selected from ZnO and $MoO_2$ as a dopant, optionally as needed. In addition, the third low-reflective material may further include at least one selected from ZnO and Mo as a dopant, optionally as needed.

The source electrode 223 and the drain electrode 224 are disposed to contact ends of the active layer 222 that are exposed without being covered by the gate insulating layer GI. For example, the source electrode 223 may contact one end of the active layer 222 and the drain electrode 224 may contact the other end of the active layer 222. In this case, the source electrode 223 and the drain electrode 224 may be respectively disposed to directly contact the active layer 222, or may contact the active layer 222 through a connection pattern.

Each of the source electrode 223 and the drain electrode 224 is formed of a plurality of layers. For example, the source electrode 223 may be formed of a double layer including the first sub-conductive layer S-sub1 and the second sub-conductive layer S-sub2. For example, the drain electrode 224 may be formed of a double layer including the first sub-conductive layer D-sub1 and the second sub-conductive layer D-sub2. As described above, in the exemplary embodiment, the source electrode 223 and the drain electrode 224 are identical to the second conductive layer. Accordingly, the respective first sub-conductive layers S-sub1 and D-sub1 of the source electrode 223 and the drain electrode 224 have identical characteristics as those of the first sub-conductive layer of the second conductive layer described above, and the respective second sub-conductive layers S-sub2 and D-sub2 of the source electrode 223 and the drain electrode 224 have identical characteristics as those of the second sub-conductive layer of the second conductive layer described above. Accordingly, duplicate descriptions concerning the first sub-conductive layer S-sub1 and the second sub-conductive layer S-sub2 of the source electrode 223 and the first sub-conductive layer D-sub1 and the second sub-conductive layer D-sub2 of the drain electrode 224 will be omitted.

The respective first sub-conductive layers S-sub1 and D-sub1 of the source electrode 223 and the drain electrode 224 may be formed of a material selected from the above-described second low-reflective material and third low-reflective material. Preferably, the respective first sub-conductive layers S-sub1 and D-sub1 of the source electrode 223 and the drain electrode 224 may be the second low-reflective material formed of a combination of Mo, $In_2O_3$ and $SnO_2$ or the third low-reflective material formed of a combination of $MoO_2$, $In_2O_3$ and $SnO_2$. In this case, the second low-reflective material may further include at least one selected from ZnO and $MoO_2$ as a dopant, optionally as needed. In addition, the third low-reflective material may further include at least one selected from ZnO and Mo as a dopant, optionally as needed.

The source electrode 223 and the drain electrode 224 may be formed through the same process as the gate electrode 221. Accordingly, the respective first sub-conductive layers S-sub1 and D-sub1 of the source electrode 223 and the drain electrode 224 may be formed of the same material as the first sub-conductive layer G-sub1 of the gate electrode 221. The respective second sub-conductive layers S-sub2 and D-sub2 of the source electrode 223 and the drain electrode 224 may be formed of the same material as the second sub-conductive layer G-sub2 of the gate electrode 221.

According to the exemplary embodiment, the respective first sub-conductive layers G-sub1, S-sub1, and D-sub1 of the gate electrode 221, the source electrode 223, and the drain electrode 224 may be formed of the second low-reflective material or the third low-reflective material. In the exemplary embodiment, when the respective first sub-conductive layers G-sub1, S-sub1, and D-sub1 of the gate electrode 221, the source electrode 223, and the drain electrode 224 are formed of the first low-reflective material, contact resistance between the active layer 222 and the source electrode 223 and the drain electrode 224 increases, and thus performance of the thin film transistor 220 can be degraded. Accordingly, in order to maintain process convenience and high element characteristics of the thin film transistor, the respective first sub-conductive layers G-sub1, S-sub1, and D-sub1 of the gate electrode 221, the source electrode 223, and the drain electrode 224 may be formed of the second low-reflective material or the third low-reflective material.

Preferably, for example, the first sub-conductive layer LS-sub1 of the light blocking layer LS may be formed of the first low-reflective material, and the respective first sub-conductive layers G-sub1, S-sub1, and D-sub1 of the gate electrode 221, the source electrode 223, and the drain electrode 224 may be formed of the second low-reflective material or the third low-reflective material. In this case, a resistance of each of the first sub-conductive layers G-sub1, S-sub1, and D-sub1 of the gate electrode 221, the source electrode 223, and the drain electrode 224 is smaller than a resistance of the first sub-conductive layer LS-sub1 of the light blocking layer LS. In this case, by greatly reducing the reflectance of the display panel PNL while maintaining high element characteristics of the thin film transistor 220, display quality such as visibility can be greatly improved.

The passivation layer 131 is disposed on the gate electrode 221, the source electrode 223 and the drain electrode 224. The passivation layer 131 is an insulating layer for protecting components under the passivation layer 131. The passivation layer 131 may be composed of a single layer or multiple layers of silicon oxide (SiOx) or silicon nitride (SiNx), but is not limited thereto.

The planarization layer 132 is disposed on the passivation layer 131. The planarization layer 132 is an insulating layer that planarizes an upper portion of the first substrate 110 on which the thin film transistor 220 is disposed. The planarization layer 132 may be formed of an organic material, and may be composed of, for example, a single layer or multiple layers of polyimide or photoacryl, but is not limited thereto. The planarization layer 132 may include a contact hole for electrically connecting the thin film transistor 220 and the first electrode 141.

The second electrode 142 that is a common electrode is formed on the planarization layer 132. The second electrode 142 is electrically connected to the common line. For example, the second electrode 142 may be formed of a transparent conductive material. For example, the transparent conductive material includes tin oxide (TO), indium tin oxide (ITO), indium zinc oxide (IZO), indium tin zinc oxide (ITZO), or the like, but is not limited thereto.

The protective layer 133 is disposed on the second electrode 142. The passivation layer is a layer for insulating the second electrode 142 and the first electrode 141 and may be formed of an inorganic insulating material or an organic insulating material. For example, the passivation layer may be composed of a single layer or multiple layers of silicon oxide (SiOx) or silicon nitride (SiNx), but is not limited thereto.

The first electrode 141 is disposed on the protective layer 133. The first electrode 141 is electrically connected to the drain electrode 224 through contact holes penetrating the protective layer 133, the planarization layer 132, and the passivation layer 131 therebelow. However, the present disclosure is not limited thereto, and the first electrode 141 may be in contact with the source electrode 223 of the thin film transistor 220.

For example, the first electrode 141 may be formed of a transparent conductive material. For example, the transparent conductive material includes tin oxide (TO), indium tin oxide (ITO), indium zinc oxide (IZO), indium tin zinc oxide (ITZO), or the like, but is not limited thereto.

The liquid crystal layer LC, the spacer SPC, and the second substrate 150 disposed on the first electrode 141 are identical to those described in the exemplary embodiment shown in FIG. 3, and therefore, duplicate descriptions thereof will be omitted.

The plurality of pad units PAD1 and PAD2 are disposed on the first substrate 110 corresponding to the non-display area NDA. For example, the first pad unit PAD1 and the second pad unit PAD2 are disposed on the first substrate 110 corresponding to the non-display area NDA. The first pad unit PAD1 is disposed on the first substrate 110 to correspond to the non-display area NDA adjacent to the display area DA. The second pad unit PAD2 is disposed outside the first pad unit PAD1 to be adjacent to the first pad unit PAD1.

For example, the first pad unit PAD1 may be a light blocking layer pad unit. The light blocking layer pad unit is a component for removing parasitic capacitance due to the light blocking layer being disposed below the thin film transistor 220. The first pad unit PAD1 includes a first light blocking layer pad electrode 281, a light blocking layer pad connection electrode 283, and a second light blocking layer pad electrode 282.

The first light blocking layer pad electrode 281 is disposed on the first substrate 110. The first light blocking layer pad electrode 281 is formed through the same process as the light blocking layer LS. Accordingly, the first light blocking layer pad electrode 281 is formed of the same material as the light blocking layer LS. As described above, in the exemplary embodiment, the first conductive layer is the light blocking layer LS. Accordingly, the first light blocking layer pad electrode 281 formed of the same material through the same process as the light blocking layer LS also has identical characteristics as those of the first conductive layer described above.

For example, the first light blocking layer pad electrode 281 includes a first sub-conductive layer LP-sub1 and a second sub-conductive layer LP-sub2. The first sub-conductive layer LP-sub1 of the first light blocking layer pad electrode 281 has identical characteristics as those of the first sub-conductive layer LS-sub1 of the light blocking layer LS, and the second sub-conductive layer LP-sub2 of the first light blocking layer pad electrode 281 has identical characteristics as those of the second sub-conductive layer LS-sub2 of the light blocking layer LS. Accordingly, duplicate descriptions of the first sub-conductive layer LP-sub1 and the second sub-conductive layer LP-sub2 of the first light blocking layer pad electrode 281 will be omitted.

The light blocking layer pad connection electrode 283 is disposed on the first light blocking layer pad electrode 281. The light blocking layer pad connection electrode 283 is disposed on the buffer layer BUF to contact the first light blocking layer pad electrode 281 that is exposed by a contact hole penetrating the buffer layer BUF.

The light blocking layer pad connection electrode 283 may be formed through the same process as the gate electrode 221, the source electrode 223, and the drain electrode 224. That is, the light blocking layer pad connection electrode 283 is formed of the same material as the gate electrode 221, the source electrode 223, and the drain electrode 224.

The light blocking layer pad connection electrode 283 includes a first sub-conductive layer CE-sub1 and a second sub-conductive layer CE-sub2. The first sub-conductive layer CE-sub1 of the light blocking layer pad connection electrode 283 has identical characteristics as those of the first sub-conductive layers G-sub1, S-sub1, and D-sub1 of the gate electrode 221, the source electrode 223, and the drain electrode 224. The second sub-conductive layer CE-sub2 of the light blocking layer pad connection electrode 283 has identical characteristics as those of the second sub-conductive layers G-sub2, S-sub2, and D-sub2 of the gate electrode 221, the source electrode 223, and the drain electrode 224. Accordingly, duplicate descriptions of the first sub-conductive layer CE-sub1 and the second sub-conductive layer CE-sub2 of the light blocking layer pad connection electrode 283 will be omitted.

When the second light blocking layer pad electrode 282 and the first light blocking layer pad electrode 281 are directly in contact, contact holes should be formed to penetrate the buffer layer BUF, the passivation layer 131 and the protective layer 133, In a process of forming the contact holes penetrating through the three layers, peripheral components may be damaged and process efficiency may be reduced. Accordingly, the light blocking layer pad connection electrode 283 may be disposed between the second light blocking layer pad electrode 282 and the first light blocking layer pad electrode 281 so that the second light blocking layer pad electrode 282 and the first light blocking layer pad electrode 281 can be in contact with each other. However, the light blocking layer pad connection electrode 283 may be omitted if a defect in the process as described above is not caused depending on designs of the thin film transistor and the pad unit The second light blocking layer pad electrode 282 is disposed on the light blocking layer pad connection electrode 283. The second light blocking layer pad electrode 282 is disposed on the protective layer 133 to be in contact with the light blocking layer pad connection electrode 283 that is exposed by contact holes penetrating the passivation layer 131 and the protective layer 133.

The second light blocking layer pad electrode 282 may be formed through the same process as the first electrode 141 that is the pixel electrode. Accordingly, the second light blocking layer pad electrode 282 is formed of the same material as the first electrode 141.

The second pad unit PAD2 may be the gate pad unit. The second pad unit PAD2 includes a first gate pad electrode 271 and a second gate pad electrode 272. The first gate pad electrode 271 is disposed on the buffer layer BUF. The first gate pad electrode 271 may be formed through the same process as the gate electrode 221, the source electrode 223, the drain electrode 224 and the light blocking layer pad connection electrode 283. Accordingly, the first gate pad electrode 271 may be formed of the same material as the gate electrode 221, the source electrode 223, the drain electrode 224, and the light blocking layer pad connection electrode 283.

For example, the first gate pad electrode 271 includes a first sub-conductive layer GP-sub1 and a second sub-conductive layer GP-sub2. The first sub-conductive layer GP-sub1 of the first gate pad electrode 271 has identical characteristics as those of the first conductive layers G-sub1, S-sub1, D-sub1, and CE-sub1 of the gate electrode 221, the source electrode 223, the drain electrode 224 and the light blocking layer pad connection electrode 283. In addition, the second sub-conductive layer GP-sub2 of the first gate pad electrode 271 has identical characteristics as those of the second sub-conductive layers G-sub2, S-sub2, D-sub2, and CE-sub2 of the gate electrode 221, the source electrode 223, the drain electrode 224, and the light blocking layer pad connection electrode 283. Accordingly, duplicate descriptions of the first sub-conductive layer GP-sub1 and the second sub-conductive layer GP-sub2 of the first gate pad electrode 271 will be omitted.

The second gate pad electrode 272 is disposed on the first gate pad electrode 271. The second gate pad electrode 272 is disposed on the protective layer 133 to contact the first gate pad electrode 271 that is exposed by contact holes penetrating the passivation layer 131 and the protective layer 133.

The second gate pad electrode 272 may be formed through the same process as the first electrode 141 which is the pixel electrode. Accordingly, the second gate pad electrode 272 is formed of the same material as the first electrode 141.

In FIG. 4, only the first pad unit PAD1 which is the light blocking layer pad unit and the second pad unit PAD2 which is the gate pad unit are shown, but a data pad unit, a touch pad unit, and the like may be further included, and pad electrodes constituting the pad units may include a layer formed of the first low-reflective material, the second low-reflective material, or the third low-reflective material described above.

In the display device 200 according to another exemplary embodiment of the present disclosure, the gate electrode 221, the source electrode 223, the drain electrode 224, the light blocking layer pad connection electrode 283, and the first gate pad electrode 271 include the first sub-conductive layers G-sub1, S-sub1, D-sub1, CE-sub1, and GP-sub1, respectively, including at least one of the second low-reflective material and the third low-reflective material described above. In addition, the light blocking layer LS and the first light blocking layer pad electrode 281 include the first sub-conductive layers LS-sub1 and LP-sub1, respectively, including at least one of the first low-reflective material, the second low-reflective material, and the third low-reflective material described above. Accordingly, reflectively due to metal layers having high reflectances is minimized, and visibility can be greatly improved.

Figure 5:
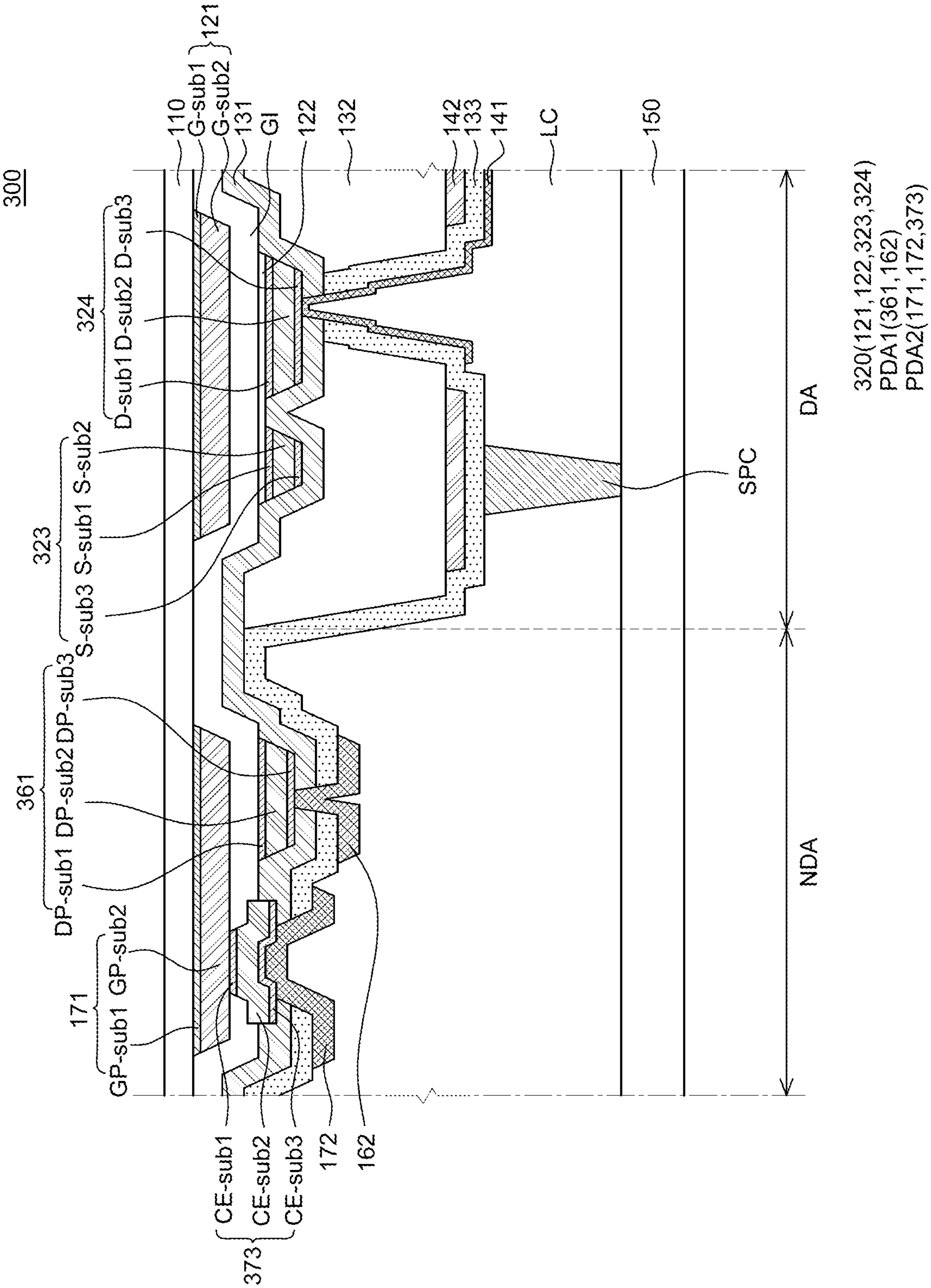
FIG. 5 is a schematic cross-sectional view illustrating a liquid crystal display panel of a display device according to still another exemplary embodiment of the present disclosure.

Hereinafter, a display device according to still another exemplary embodiment of the present disclosure will be described with reference to FIG. 5. FIG. 5 is a schematic cross-sectional view illustrating a liquid crystal display panel of a display device according to still another exemplary embodiment of the present disclosure. A liquid crystal display panel of a display device 300 shown in FIG. 5 substantially identical to the liquid crystal display panel PNL of the display device 100 in FIG. 3 except that each of a source electrode, a drain electrode, a first data pad electrode, and a gate pad connection electrode further includes a third sub-conductive layer. Accordingly, duplicate descriptions will be omitted.

A source electrode 323 which is the second conductive layer further includes a third sub-conductive layer S-sub3 disposed on the second sub-conductive layer S-sub2.

For example, the third sub-conductive layer S-sub3 may be formed of at least one selected from the second low-reflective material and the third low-reflective material described above. Since the second low-reflective material and the third low-reflective material have been described above, duplicate descriptions thereof will be omitted.

When the third sub-conductive layer S-sub3 of the source electrode 323 is formed of the second low-reflective material or the third low-reflective material described above, a reflectance is further reduced and thus, visibility of the display device can be maximized.

As another example, the third sub-conductive layer S-sub3 may be formed of one metal selected from among the group consisting of Al, Cu, Mo, Ti, and Ag, or an alloy including at least one of the metals, and may be, specifically, formed of MoTi. When the third sub-conductive layer S-sub3 is formed of the above metal materials, there is an effect of reducing a reflectance while maintaining high performance of a thin film transistor 320.

A drain electrode 324 which is the second conductive layer further includes a third sub-conductive layer D-sub3 disposed on the second sub-conductive layer D-sub2. Since the third sub-conductive layer D-sub3 of the drain electrode 324 is identical to the third sub-conductive layer S-sub3 of the source electrode 323, a duplicate description thereof will be omitted.

As described above with reference to FIG. 3, a first data pad electrode 361 and a gate pad connection electrode 373 may be formed of the same material through the same process as the source electrode 323 and the drain electrode 324 for convenience of the process.

Accordingly, the first data pad electrode 361 and the gate pad connection electrode 373 include third sub-conductive layers DP-sub3 and CE-sub3 disposed on the second sub-conductive layers DP-sub2 and CE-sub2, respectively, in the same manner as the source electrode 323 and the drain electrode 324. The third sub-conductive layer DP-sub3 of the first data pad electrode 361 and the third sub-conductive layer CE-sub3 of the gate pad connection electrode 373 are identical to the third sub-conductive layer S-sub3 of the source electrode 323, and accordingly, duplicate description thereof will be omitted.

The display device 300 according to still another exemplary embodiment of the present disclosure further includes the third sub-conductive layers S-sub3, D-sub3, DP-sub3, and CE-sub3 formed of a low-reflective material or at least one metal material selected from among the group consisting of Al, Cu, Mo, Ti, and Ag, so that the reflectance is reduced while maintaining high characteristics of the thin film transistor and thus, there is an effect of improving display quality of the display device.

Hereinafter, effects of the present disclosure will be described in more detail through Examples and Comparative Examples. However, the following Examples are for illustration of the present disclosure, and the scope of the present disclosure is not limited by the following Examples.

Experimental Example 1

Figure 6:
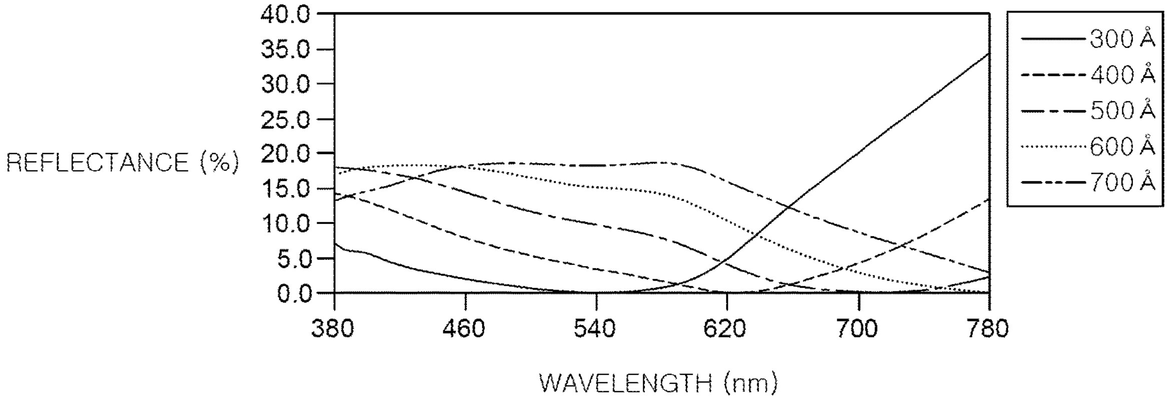
FIG. 6 is a graph showing changes in reflectance according to thicknesses when a first sub-conductive layer has a refractive index of 2.7 and an extinction coefficient of 0.8.
Figure 7:
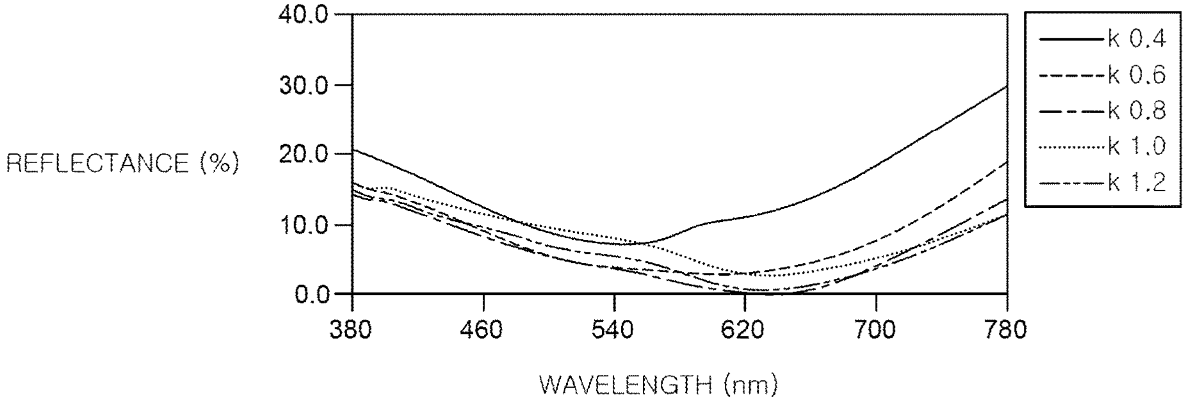
FIG. 7 is a graph showing changes in reflectance according to extinction coefficients when the first sub-conductive layer has a refractive index of 2.7 and a thickness of 400 Å.
Figure 8:
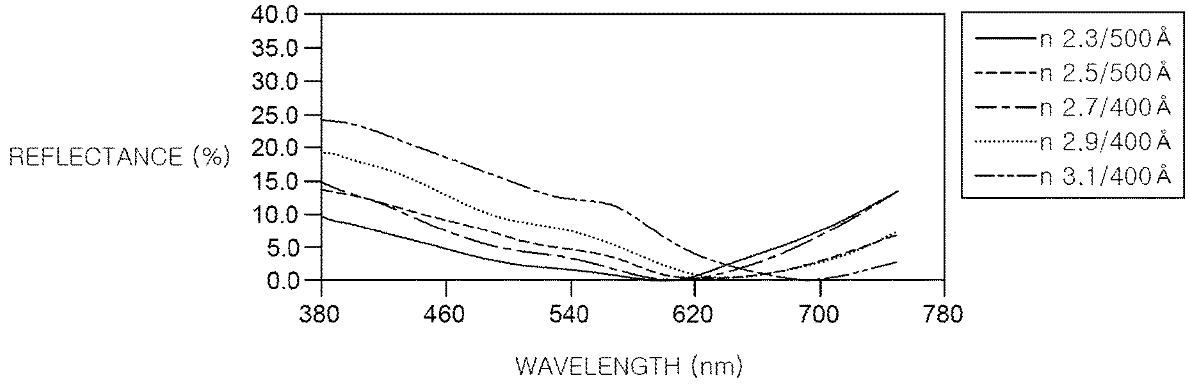
FIG. 8 is a graph showing changes in reflectance according to refractive indexes and thicknesses when the extinction coefficient of the first sub-conductive layer is 0.8.

In thin film transistors having a back-channel etch (BCE) structure, when gate electrodes have a structure in which a first sub-conductive layer formed of a low-reflective material and a second sub-conductive layer formed of Cu are stacked, reflectances according to refractive indexes (n), extinction coefficients (k), and thicknesses of the first sub-conductive layers were simulated. Consequent results are shown in Table 1 and FIGS. 6 to 8 below. FIG. 6 is a graph showing changes in reflectance according to thicknesses when the first sub-conductive layer has a refractive index of 2.7 and an extinction coefficient of 0.8. FIG. 7 is a graph showing changes in reflectance according to extinction coefficients when the first sub-conductive layer has a refractive index of 2.7 and a thickness of 400 Å. FIG. 8 is a graph showing changes in reflectance according to refractive indexes and thicknesses when the extinction coefficient of the first sub-conductive layer is 0.8.

TABLE 1

| | k | | | | | | | Thickness |
|---|---|---|---|---|---|---|---|---|
| n | 0.2 | 0.4 | 0.6 | 0.8 | 1.0 | 1.2 | 1.4 | (Å) |
| 2.3 | 27.6 | 12.0 | 5.9 | 4.5 | 5.6 | 8.1 | 10.5 | 500 |
| 2.5 | 29.4 | 13.3 | 6.8 | 5.1 | 6.0 | 8.3 | 10.6 | 500 |
| 2.7 | 29.7 | 14.5 | 7.8 | 5.7 | 6.2 | 8.1 | 10.7 | 400 |
| 2.9 | 32.6 | 16.8 | 9.8 | 7.3 | 7.4 | 9.0 | 11.5 | 400 |
| 3.1 | 36.9 | 21.0 | 13.4 | 10.3 | 10.0 | 11.1 | 13.1 | 400 |

First, referring to Table 1 and FIG. 6 together, it can be confirmed that as the thickness of the first sub-conductive layer of the gate electrode is thinner, the reflectance in a long-wavelength band increases, and as the thickness is greater, the reflectance in a short-wavelength band increases. In addition, when the thickness of the first sub-conductive layer is 400 Å, it can be confirmed that the reflectance is low in a wide wavelength range. Next, referring to Table 1 and FIG. 7 together, when the extinction coefficient of the first sub-conductive layer of the gate electrode is less than 0.6 or greater than 1.2, it can be confirmed that the reflectance is high. It can be confirmed that the reflectance is lower when the extinction coefficient of the first sub-conductive layer is in a range of 0.6 to 1.0, preferably 0.8 to 1.0.

In addition, referring to Table 1 and FIG. 8 together, when the refractive index of the first sub-conductive layer of the gate electrode is 2.3 to 2.7, it can be confirmed that the reflectance is low within a wide wavelength range. When the refractive index exceeds 2.9, it can be confirmed that the reflectance in a short-wavelength band increases.

Experimental Example 2

Figure 9:
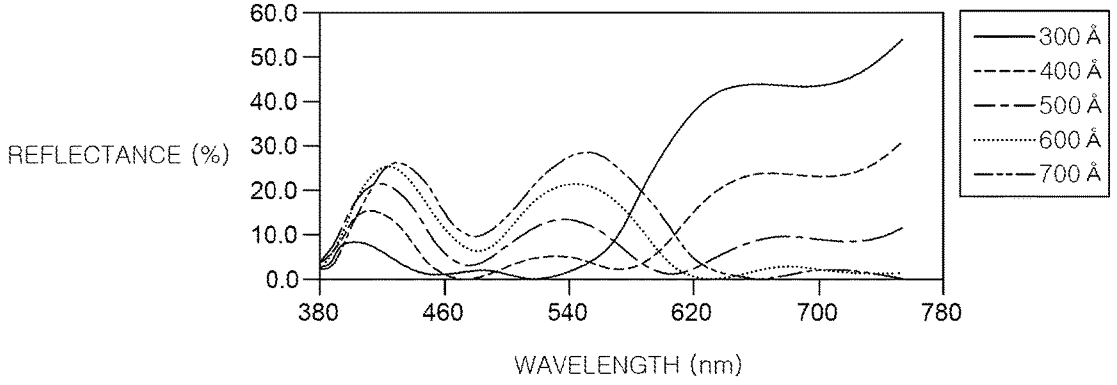
FIG. 9 is a graph showing changes in reflectance according to thicknesses when the refractive index of the first sub-conductive layer is 2.3 and the extinction coefficient of the first sub-conductive layer is 0.6.
Figure 10:
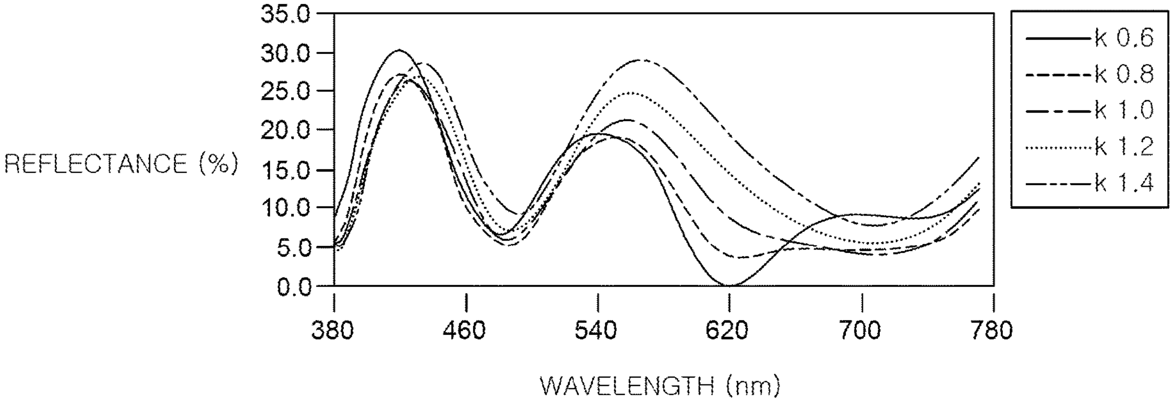
FIG. 10 is a graph showing changes in reflectance according to extinction coefficients when the first sub-conductive layer has a refractive index of 2.7 and a thickness of 400 Å.

In thin film transistors having a BCE structure, when source electrodes and drain electrodes have a structure in which a first sub-conductive layer formed of a low-reflective material and a second sub-conductive layer formed of Cu are stacked, reflectances according to refractive indexes (n), extinction coefficients (k), and thicknesses of the first sub-conductive layers were simulated. Consequent results are shown in Table 2 and FIGS. 9 to 10 below. FIG. 9 is a graph showing changes in reflectance according to thicknesses when the refractive index of the first sub-conductive layer is 2.3 and the extinction coefficient of the first sub-conductive layer is 0.6. FIG. 10 is a graph showing changes in reflectance according to extinction coefficients when the first sub-conductive layer has a refractive index of 2.7 and a thickness of 400 Å.

TABLE 2

| | k | | | | | | Thickness |
|---|---|---|---|---|---|---|---|
| n | 0.4 | 0.6 | 0.8 | 1.0 | 1.2 | 1.4 | (Å) |
| 2.3 | 14.6 | 9.4 | 8.8 | 10.4 | 13.3 | 16.7 | 500 |
| 2.5 | 16.8 | 11.5 | 10.3 | 11.4 | 13.7 | 16.8 | 400 |
| 2.7 | 17.8 | 12.2 | 10.8 | 11.8 | 14.1 | 17.0 | 400 |
| 2.9 | 20.7 | 14.5 | 12.7 | 13.1 | 14.8 | 17.2 | 300 |
| 3.1 | — | 14.8 | 13.0 | 13.3 | 14.9 | 17.3 | 300 |

First, referring to Table 2, when the refractive index of the first sub-conductive layer is 2.3 to 2.7, it can be confirmed that the refractive index is low. Also, referring to Table 2 and FIG. 9, it can be confirmed that as the thicknesses of the first sub-conductive layers of the source electrode and the drain electrode are thinner, it can be confirmed that the reflectance in a long-wavelength band increases, and as the thicknesses of the first sub-conductive layers of the source electrode and the drain electrode are thicker, the reflectance in a short-wavelength band increases. In addition, when the thickness of the first sub-conductive layer is 400 Å, it can be confirmed that the reflectance is low in a wide wavelength range.

In addition, referring to Table 2 and FIG. 10 together, when the extinction coefficient of the first sub-conductive layer of the source electrode and the drain electrode is less than 0.6 or greater than 1.2, it can be confirmed that the reflectance is high, and when it is greater than 1.2, it can be confirmed that the reflectance is high in an entire wavelength range. It can be confirmed that the reflectance is lower when the extinction coefficient of the first sub-conductive layer is in a range of 0.8 to 1.0.

Experimental Example 3

As seen in Experimental Examples 1 and 2, it can be confirmed that reflectances of gate electrodes, source electrodes, and drain electrodes vary according to refractive indexes and extinction coefficients of first sub-conductive layers formed of a low-reflective material. The refractive index and the extinction coefficient of the first sub-conductive layer may be adjusted according to a composition of the low-reflective material. After forming the conductive layers by varying a composition of the low-reflective material on a substrate, the refractive indexes (n), the extinction coefficients (k), and reflectances of unit films were measured. Specifically, a first sub-conductive layer formed of a first low-reflective material composed of a combination of Mo, MoOx($MoO_2$+$MoO_3$), $Nb_2O_5$, and ZnO and a second sub-conductive layer (4000 Å) composed of Cu were stacked on a substrate to prepare a gate electrode. At this time, a ratio of Mo and a thickness of the first sub-conductive layer are as shown in Table 3 below. For the gate electrode prepared as described above, the reflectance toward a substrate surface using CM2600d (Konica Minolta Co.) was measured. Consequent results are shown in Table 3 below.

TABLE 3

| Classification | Mo Content (n, k) | Thickness (Å) | L*(D65) | a*(D65) | b*(D65) | Y*(D65) |
|---|---|---|---|---|---|---|
| 3A1 | 7 wt % | 300 | 28.61 | 11.05 | −2.62 | 5.69 |
| 3A2 | (n: 2.7, | 320 | 30.78 | −3.87 | −12.05 | 6.56 |
| 3A3 | k: 0.9) | 360 | 32.67 | −5.58 | −12.02 | 7.39 |
| 3B1 | 15 wt % | 274 | 31.23 | −2.6 | −10.62 | 6.75 |
| 3B2 | (n: 2.8, | 303 | 33.44 | −6.39 | −11.87 | 7.74 |
| 3B3 | k: 1.2) | 329 | 38.61 | −7.79 | −10.55 | 10.44 |
| 3C1 | 23 w % | 300 | 35.02 | −6.65 | −11.21 | 8.51 |
| 3C2 | (n: 2.9, | 350 | 41.04 | −7.49 | −9.58 | 11.89 |
| 3C3 | k: 1.4) | 400 | 45.61 | −6.42 | −7.21 | 14.98 |
| 3D1 | 30 wt % | 300 | 38.05 | −6.25 | −9.94 | 10.12 |
| 3D2 | (n: 3.0, | 350 | 42.45 | −7.2 | −9.04 | 12.79 |
| 3D3 | k: 1.5) | 400 | 47.3 | −6.3 | −6.81 | 16.25 |

Referring to Table 3, it can be confirmed that the refractive indexes and extinction coefficients of the unit films vary depending on the contents of Mo. The refractive indexes and the extinction coefficients tend to increase as the Mo content increases from 7 wt % to 30 wt %. In addition, it can be confirmed that L values and Y values increase as the content of Mo increases from 7 wt % to 30 wt %, that is, as the refractive index and the extinction coefficient increase, it can be confirmed that L values and Y values increase. An increase in the L value and the Y value means that the reflectance increases. Meanwhile, it can be confirmed that the L value and the Y value are lowest when the content of Mo is 7 wt %, and from this, it can be confirmed that the reflectance is lowest when the refractive index is 2.7 and the extinction coefficient is 0.9.

Experimental Example 4

In order to examine reflectances according to thicknesses of first sub-conductive layers formed of a first low-reflective material, the conductive layers were formed by varying the thicknesses of the first sub-conductive layers formed of the first low-reflective material. Specifically, conductive layers were formed by stacking the first sub-conductive layer formed of the first low-reflective material having a combination of Mo, MoOx($MoO_2$+$MoO_3$),$Nb_2O_5$, and ZnO, and a second sub-conductive layer (4000 Å) formed of Cu on a substrate. At this time, the content of Mo is 7 wt %, a refractive index of the first sub-conductive layer is 2.7, and an extinction coefficient of the first sub-conductive layer is 0.9. When the first sub-conductive layer was stacked, the thickness was varied within a range of 274 Å to 475 Å, and a reflectance (550 nm) of each of specimens was measured. Consequent results are shown in Table 4 below.

TABLE 4

| Classification | Thickness (Å) | L*(D65) | a*(D65) | b*(D65) | Y*(D65) | Reflectance (%) |
|---|---|---|---|---|---|---|
| 4A1 | 274 | 34.9 | 20.4 | 13.6 | 8.4 | 6.0 |
| 4A2 | 302 | 30.2 | 15.6 | 4.3 | 6.3 | 4.8 |
| 4A3 | 329 | 28.0 | 10.1 | −3.2 | 5.5 | 4.6 |

TABLE 4-continued

| Classification | Thickness (Å) | L*(D65) | a*(D65) | b*(D65) | Y*(D65) | Reflectance (%) |
|---|---|---|---|---|---|---|
| 4A4 | 354 | 27.9 | 5.0 | −7.6 | 5.4 | 5.0 |
| 4A5 | 370 | 28.3 | 2.8 | −9.1 | 5.6 | 5.4 |
| 4A6 | 396 | 29.8 | −0.6 | −10.9 | 3.2 | 6.2 |
| 4A7 | 419 | 30.9 | −2.0 | −11.2 | 6.6 | 6.8 |
| 4A8 | 475 | 38.4 | −5.1 | −9.8 | 10.3 | 10.8 |

Referring to Table 4, when the first sub-conductive layer formed of the first low-reflective material according to the present disclosure is included, it can be confirmed that the unit film has a reflectance of 10.8% or less, which is very low. In particular, when the thicknesses of the first sub-conductive layers are 370 Å, 396 Å, and 419 Å, it can be confirmed that natural colors can be implemented while the reflectance is as low as 5% to 7%, which is more effective in improving display quality of a display device.

Experimental Example 5

Example 5-1

A gate electrode was formed by stacking a first sub-conductive layer formed of a first low-reflective material having a combination of Mo, MoOx($MoO_2$+$MoO_3$), $Nb_2O_5$, and ZnO and a second sub-conductive layer (4000 Å) formed of Cu on a substrate. At this time, the content of Mo was 7 wt %, a refractive index of the first sub-conductive layer was 2.7, an extinction coefficient of the first sub-conductive layer was 0.9, and a thickness of the first sub-conductive layer was 370 Å.

Example 5-2

A gate electrode was formed in the same manner as in Example 5-1, except that the thickness of the first sub-conductive layer was changed to 396 Å.

Example 5-3

A gate electrode was formed in the same manner as in Example 5-1, except that the thickness of the first sub-conductive layer was changed to 419 Å.

Comparative Example 5-1

A gate electrode was formed in the same manner as in Example 5-1, except that MoTi was used instead of the first low-reflective material as the first sub-conductive layer in Example 5-1.

Reflectances (380 nm to 740 nm) of the gate electrodes according to Comparative Example 5-1 and Examples 5-1 to 5-3 were measured and are shown in Table 5 below.

TABLE 5

| | Comparative Example 5-1 | Example 5-1 | Example 5-2 | Example 5-3 |
|---|---|---|---|---|
| L*(D65) | 35.2 | 5.6 | 6.2 | 6.8 |
| a*(D65) | 65.9 | 28.3 | 29.8 | 31.4 |
| b*(D65) | 7.3 | 2.8 | −0.6 | −2.3 |
| Y*(D65) | 4.3 | −9.1 | −10.9 | −11.3 |
| Reflectance | 39.5% | 8.6% | 8.4% | 8.6% |

Referring to Table 5, it can be confirmed that the reflectances of Examples 5-1 to 5-3 in which the first sub-conductive layer of the gate electrode was formed of the first low-reflective material were approximately 8%, which is about 20% of the reflectance of Comparative Example 5-1, quite low.

Experimental Example 6

Example 6-1

A first sub-conductive layer (302 Å) formed of a second low-reflective material (or a third low-reflective material) having a combination of Mo (or $MoO_2$), $In_2O_3$ and $SnO_2$ and a second sub-conductive layer (4000 Å) formed of Cu were stacked on a substrate to form a source electrode and a drain electrode.

Example 6-2

A source electrode and a drain electrode were formed in the same manner as in Example 6-1, except that the thickness of the first sub-conductive layer was changed to 354 Å.

Example 6-3

A source electrode and a drain electrode were formed in the same manner as in Example 6-1, except that the thickness of the first sub-conductive layer was changed to 396 Å.

Comparative Example 6-1

A source electrode and a drain electrode were formed in the same manner as in Example 6-1, except that MoTi was used instead of the first low-reflective material as the first sub-conductive layer in Example 6-1.

Reflectances (380 nm to 740 nm) of unit films according to Comparative Example 6-1 and Examples 6-1 to 6-3 were measured and shown in Table 6 below.

TABLE 6

| | Comparative Example 6-1 | Example 6-1 | Example 6-2 | Example 6-3 |
|---|---|---|---|---|
| L*(D65) | 72.5 | 36.1 | 36.3 | 40.1 |
| a*(D65) | 0.5 | 5.0 | −14.1 | −23.9 |
| b*(D65) | 19.3 | 11.4 | 2.9 | 2.0 |
| Y*(D65) | 44.4 | 9.1 | 9.2 | 11.3 |
| Reflectance | 43.4% | 13.0% | 10.3% | 10.0% |

Referring to Table 6, it can be confirmed that reflectances of Examples 6-1 to 6-3 in which the first sub-conductive layers of the source and drain electrodes were formed of the first low-reflective material were 13%, 10.3%, and 10%, respectively, which are about 25% of the reflectance of Comparative Example 6-1 formed of MoTi, considerably low. In addition, in the case of Example 6-3 in which the thickness of the first sub-conductive layer is 396 Å, it can be confirmed that the reflectance is lowest in a wavelength range of 380 nm to 740 nm with an excellent color.

Experimental Example 7

Figure 11:
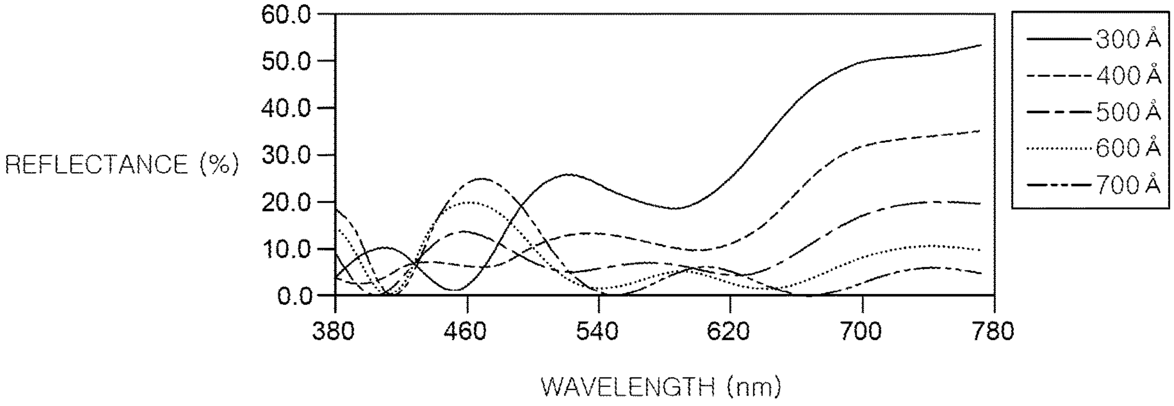
FIG. 11 is a graph showing changes in reflectance according to thicknesses when the first sub-conductive layer has a refractive index of 2.1 and an extinction coefficient of 0.8.
Figure 12:
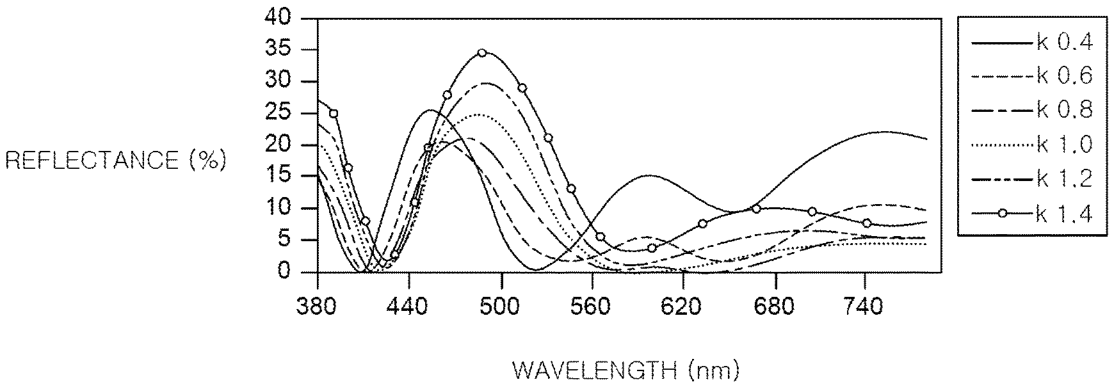
FIG. 12 is a graph showing changes in reflectance according to extinction coefficients when the first sub-conductive layer has a refractive index of 2.1 and a thickness of 600 Å.
Figure 13:
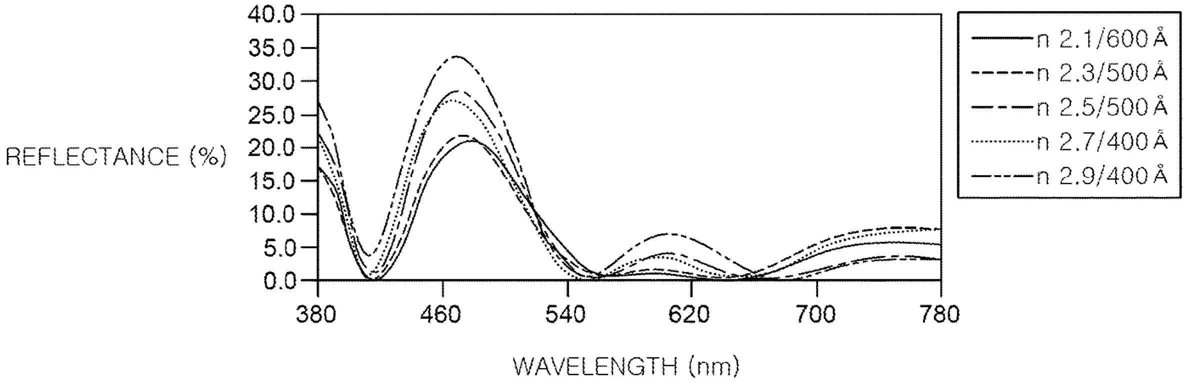
FIG. 13 is a graph showing changes in reflectance according to refractive indexes and thicknesses when the extinction coefficient of the first sub-conductive layer is 0.8.

In thin film transistors having a co-planar structure, when gate electrodes have a structure in which a first sub-conductive layer formed of a low-reflective material and a second sub-conductive layer formed of Cu are stacked, reflectances according to refractive indexes (n), extinction coefficients (k) and thicknesses of the first sub-conductive layers were simulated. Consequent results are shown in Table 7 and FIGS. 11 to 13 below. FIG. 11 is a graph showing changes in reflectance according to thicknesses when the first sub-conductive layer has a refractive index of 2.1 and an extinction coefficient of 0.8. FIG. 12 is a graph showing changes in reflectance according to extinction coefficients when the first sub-conductive layer has a refractive index of 2.1 and a thickness of 600 Å. FIG. 13 is a graph showing changes in reflectance according to refractive indexes and thicknesses when the extinction coefficient of the first sub-conductive layer is 0.8.

TABLE 7

| | k | | | | | | | Thickness |
|---|---|---|---|---|---|---|---|---|
| n | 0.2 | 0.4 | 0.6 | 0.8 | 1.0 | 1.2 | 1.4 | (Å) |
| 2.1 | 28.6 | 13.2 | 7.4 | 6.2 | 7.5 | 10 | 13.2 | 600 |
| 2.3 | 29.8 | 14.6 | 8.4 | 6.8 | 7.5 | 9.6 | 12.5 | 500 |
| 2.5 | 31.4 | 15.8 | 9.2 | 7.3 | 7.9 | 9.8 | 12.5 | 500 |
| 2.7 | 31.5 | 16.7 | 10.1 | 7.8 | 7.9 | 9.5 | 11.8 | 400 |
| 2.9 | 34.2 | 18.9 | 11.8 | 9.2 | 9.1 | 10.4 | 12.5 | 400 |

First, referring to Table 7 and FIG. 11 together, it can be confirmed that as the thickness of the first sub-conductive layer of the gate electrode is thinner, the reflectance in a long-wavelength band increases, and as the thickness is thicker, the reflectance in a short-wavelength band increases. In addition, when the thickness of the first sub-conductive layer is 500 Å to 600 Å, it can be confirmed that the reflectance is low in a wide wavelength range. Next, referring to Table 7 and FIG. 12 together, when the extinction coefficient of the first sub-conductive layer of the gate electrode is less than 0.6 or greater than 1.2, it can be confirmed that the reflectance is high. It can be confirmed that the reflectance is lower when the extinction coefficient of the first sub-conductive layer is in a range of 0.6 to 1.2, preferably 0.8 to 1.0.

In addition, referring to Table 7 and FIG. 13 together, when the refractive index of the first sub-conductive layer of the gate electrode is 2.1 to 2.3, it can be confirmed that the reflectance is low within a wide wavelength range. When the refractive index exceeds 2.9, it can be confirmed that the reflectance in a short-wavelength band increases.

Experimental Example 8

Example 8-1

A first low-reflective material (MoNbOx) having a combination of Mo, MoOx($MoO_2$+$MoO_3$), $Nb_2O_5$, and ZnO, and a second low-reflective material (or third low-reflective material) having a combination of Mo (or $MoO_2$), $In_2O_3$ and $SnO_2$ (ITMO) were used to manufacture a display panel having a structure shown in FIG. 3.

Specifically, a thin film transistor where, in the structure shown in FIG. 3, a gate electrode includes a first sub-conductive layer (400 Å) formed of the first low-reflective material and a second sub-conductive layer (4000 Å) formed of Cu, and each of a source electrode and a drain electrode includes a first sub-conductive layer (350 Å) formed of the second low-reflective material (or a third low-reflective material) and a second sub-conductive layer (4000 Å) formed of Cu, and a display panel including the thin film transistor were manufactured.

Comparative Example 8-1

A thin film transistor and a display panel including the thin film transistor were manufactured in the same manner as in Example 8-1, except that when forming the gate electrode, a first sub-conductive layer having a thickness of 100 Å was formed using MoTi instead of the first low-reflective material, and when forming the source and drain electrodes, a first sub-conductive layer having a thickness of 100 Å was formed using MoTi instead of the second low-reflective material (or the third low-reflective material), in Comparative Example 8-1.

Comparative Example 8-2

A thin film transistor and a display panel including the thin film transistor were manufactured in the same manner as in Example 8-1, except that when forming the source and drain electrodes, a first sub-conductive layer having a thickness of 100 Å was formed using MoTi instead of the second low-reflective material (or the third low-reflective material), in Comparative Example 8-2.

Figure 14:
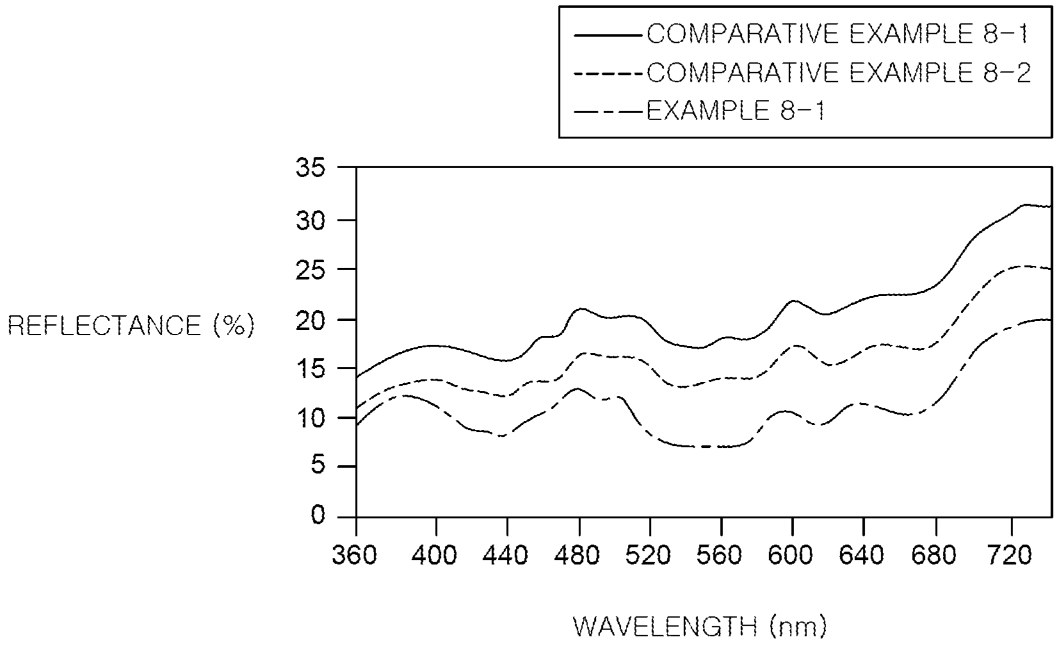
FIG. 14 is a graph showing reflectances for respective wavelengths of display panels according to Example 8-1, Comparative Example 8-1, and Comparative Example 8-2.

Reflectances (360 nm to 740 nm) of unit films and the display panels manufactured according to Example 8-1, Comparative Example 8-1, and Comparative Example 8-2, were respectively measured, and consequent results are shown in Table 8 and FIG. 14 below. FIG. 14 is a graph showing reflectances for respective wavelengths of the display panels according to Example 8-1, Comparative Example 8-1, and Comparative Example 8-2.

TABLE 8

| | | Example 8-1 | | Comparative Example 8-1 | | Comparative Example 8-2 | |
|---|---|---|---|---|---|---|---|
| Configuration of Conductive layer | | Gate MoNbOx/Cu | S/D ITMO/Cu | Gate MoTi/Cu | S/D MoTi/Cu | Gate MoNbOx/Cu | S/D MoTi/Cu |
| Unit Film | Y*(D65) | 6.2 | 9.2 | 35.2 | 44.4 | 6.2 | 44.4 |
| Reflectance | L*(D65) | 29.8 | 36.3 | 65.9 | 72.5 | 29.8 | 72.5 |
| | a*(D65) | −0.6 | −14.1 | 7.3 | 0.5 | −0.6 | 0.5 |
| | b*(D65) | −10.9 | 2.9 | 4.3 | 19.3 | −10.9 | 19.3 |
| Display | Y*(D65) | 8.8 ± 0.16 | | 18.8 ± 0.16 | | 14.6 ± 0.19 | |
| Panel | L*(D65) | 35.6 ± 0.30 | | 50.4 ± 0.19 | | 45.0 ± 0.26 | |
| Reflectance | a*(D65) | 2.0 ± 1.62 | | 1.7 ± 0.67 | | 1.0 ± 0.64 | |
| | b*(D65) | −3.7 ± 0.52 | | 3.2 ± 0.38 | | ±0.42 | |

First, referring to Table 8, when each of the gate electrode, the source electrode, and the drain electrode includes the first sub-conductive layer including the low-reflective material, it can be confirmed that Y values of the unit films are 6.2 and 9.2, which is significantly lower than those of Comparative Example 8-1 and Example 8-2. Also, referring to FIG. 14, in the case of Comparative Example 8-1 in which none of the gate electrode, the source electrode, and the drain electrode includes the first sub-conductive layer formed of the low-reflective material, it can be confirmed that the reflectance of the display panel is highest in a wavelength range of 360 nm to 740 nm. In the case of Comparative Example 8-2 in which the gate electrode includes the first sub-conductive layer formed of the first low-reflective material, it can be confirmed that the reflectance of the gate electrode itself is lower than that of Comparative Example 8-1, and the reflectance of the display panel is also improved, but effects thereof are insignificant compared to Example 8-1. In the case of Example 8-1 in which the gate electrode, the source electrode, and the drain electrode all include the first sub-conductive layer formed of the low-reflective material, it can be confirmed that the reflectance is considerably lower than those of Comparative Examples 8-1 and 8-2 in a wavelength range of 360 nm to 740 nm, and the reflectance at a wavelength of 550 nm is 8.8%, considerably low. In addition, a conventional display panel exhibits a reddish color due to a high reflectance of conductive layers. However, in the display panel according to Example 8-1, there is an effect of improving visibility and colors as color coordinates are shifted toward a blueish side.

Experimental Example 9

Example 9-1

A display panel was manufactured in the same manner as in Example 8-1, except that a polarizing plate was disposed on a surface of the substrate opposite to a surface thereof on which the gate electrode was formed, in the display panel manufactured in Example 9-1.

Example 9-2

A display panel was manufactured in the same manner as in Example 8-1, except that a polarizing plate to which an anti-glare and low-reflective (AGLR) coating layer is applied was disposed on the surface of the substrate opposite to the surface thereof on which the gate electrode was formed, in the display panel manufactured in Example 9-2.

Example 9-3

A display panel was manufactured in the same manner as in Example 8-1, except that a polarizing plate to which specular free (SF) is applied was disposed on the surface of the substrate opposite to the surface thereof on which the gate electrode was formed, in the display panel manufactured in Example 9-3.

Reflectances of the display panels according to Examples 9-1, 9-2, and 9-3 were measured, and consequent results thereof are shown in Table 9 below.

TABLE 9

| | Example 8-1 | Example 9-1 | Example 9-2 | Example 9-3 |
|---|---|---|---|---|
| Kind of Polarizing Plate | — | Polarizing Plate | AGLR/Polarizing Plate | SF/Polarizing Plate |
| Y*(D65) | 8.8 ± 0.16 | 6.3 ± 0.03 | 3.6 ± 0.05 | 2.4 ± 0.05 |
| L*(D65) | 35.6 ± 0.30 | 30.2 ± 0.08 | 22.3 ± 0.17 | 17.3 ± 0.23 |
| a*(D65) | 2.0 ± 1.62 | 0.7 ± 0.77 | 1.5 ± 1.71 | 2.3 ± 1.87 |
| b*(D65) | −3.7 ± 0.52 | −1.1 ± 0.31 | −2.9 ± 0.55 | 0.0 ± 0.55 |

Referring to Table 9, it can be confirmed that the display panels of Examples 9-1, 9-2, and 9-3 further including the polarizing plates have Y values lower than that of the display panel of Example 8-1. In particular, in Example 9-2 to which the AGLR/polarizing plate was applied and Example 9-3 to which the SF/polarizing plate was applied, it can be confirmed that the reflectance of the display panel is less than 5%, considerably low, and color coordinate improvement effects are considerably excellent. Although not specifically described, in a process of forming the conductive layers formed of the low-reflective materials to proceed with the above experiments, when the low-reflective material of the present disclosure, MoNbOx or ITMO, was etched by using an existing etchant (e.g., SL-CI03), it was confirmed that the conductive layers were formed without a residual film. In addition, it was confirmed that a CD bias (etch time 70 to 75 second) of the conductive layer in which MoNbOx or ITMO and Cu were stacked was −0.7 μm to −0.9 μm. That is, when the low-reflective material according to the present disclosure is used, it can be applied immediately without a significant change in process by using an etchant used in a conventional process of forming MoTi/Cu conductive layers.

The exemplary embodiments of the present disclosure can also be described as follows:

According to an aspect of the present disclosure, display device, comprises a substrate and a conductive layer on the substrate, wherein the conductive layer includes a first conductive layer including a first sub-conductive layer and a second sub-conductive layer disposed on the first sub-conductive layer; and a second conductive layer disposed on the first conductive layer and including a first sub-conductive layer and a second sub-conductive layer disposed on the first sub-conductive layer, wherein the first sub-conductive layer of the first conductive layer includes at least one selected from among a first low-reflective material including a first metal, a first metal oxide, a second metal oxide, and a third metal oxide; a second low-reflective material including a second metal and two or more different conductive oxides; and a third low-reflective material including a fourth metal oxide and two or more different conductive oxides, wherein the first sub-conductive layer of the second conductive layer includes at least one selected from the second low-reflective material and the third low-reflective material.

The first metal may be at least one selected from among molybdenum (Mo), nickel (Ni), copper (Cu), and tungsten (W), the first metal oxide may be at least one selected from among $MoO_2$, $MoO_3$, NiO, CuO and $Cu_2O$, the second metal oxide may be at least one selected from among $Nb_2O_5$, $WO_3$, $TiO_2$, $ZrO_2$ and $HfO_2$, and the third metal oxide is ZnO.

The first low-reflective material may include a total of 70 w % to 80 wt % of the first metal and the first metal oxide; 15 w % to 25 wt % of the second metal oxide; and 0 to 5 wt % of the third metal oxide.

A weight ratio of the first metal to the first metal oxide may be 3 to 15:85 to 97.

The second metal may be at least one selected from molybdenum (Mo) and tungsten (W), and the conductive oxides may be two or more selected from among $In_2O_3$, $SnO_2$ and ZnO.

The second low-reflective material may include 20 wt % to 40 wt % of the second metal and 60 wt % to 80 wt % of the conductive oxides.

The fourth metal oxide may be at least one selected from among $MoO_3$, $MoO_2$ and $WO_3$, and the conductive oxides may be two or more selected from among $In_2O_3$, $SnO_2$ and ZnO.

The third low-reflective material may include 50 wt % to 70 wt % of the fourth metal oxide and 30 wt % to 50 wt % of the conductive oxides.

Each of the second low-reflective material and the third low-reflective material may further include a dopant.

Each of the first sub-conductive layer of the first conductive layer and the first sub-conductive layer of the second conductive layer may have a refractive index (n) of 2.1 to 2.9, and an extinction coefficient (k) of 0.6 to 1.2 and a thickness of 300 Å to 700 Å.

A resistance of the first sub-conductive layer of the second conductive layer may be smaller than a resistance of the first sub-conductive layer of the first conductive layer.

The display device may further comprise a thin film transistor including a gate electrode disposed on the substrate, an active layer disposed on the gate electrode with a gate insulating layer interposed therebetween, and a source electrode and a drain electrode contacting the active layer, wherein the first conductive layer may be the gate electrode of the thin film transistor, and the second conductive layer may be at least one of the source electrode and the drain electrode of the thin film transistor.

The second conductive layer may further include a third sub-conductive layer disposed on the second sub-conductive layer.

The third sub-conductive layer may be formed of the second low-reflective material, the third low-reflective material, or at least one metal material selected from among the group consisting of aluminum (Al), copper (Cu), molybdenum (Mo), titanium (Ti), and silver (Ag).

The display device may further comprises a first pad unit and a second pad unit disposed on the substrate, wherein the display device may include a display area and a non-display area surrounding the display area, wherein the thin film transistor may be disposed on the substrate corresponding to the display area, wherein the first pad unit and the second pad unit may be disposed in the non-display area, and wherein each of the first pad unit and the second pad unit may include a first pad electrode and a second pad electrode.

The first conductive layer may be the first pad electrode of the second pad unit, and the second conductive layer may be the first pad electrode of the first pad unit.

The second pad unit may further include a pad connection electrode disposed between the first pad electrode and the second pad electrode of the second pad unit, and wherein the second conductive layer may be the pad connection electrode.

The display device may further comprise a thin film transistor including an active layer disposed on the substrate, a gate electrode disposed on the active layer with a gate insulating layer interposed therebetween, and a source electrode and a drain electrode contacting the active layer, wherein the second conductive layer may be at least one of the gate electrode, the source electrode, and the drain electrode of the thin film transistor.

The display device may further comprise a light blocking layer disposed on the substrate, wherein the first conductive layer may be the light blocking layer.

The display device may further comprise a first pad unit and a second pad unit disposed on the substrate, wherein the display device may include a display area and a non-display area surrounding the display area, wherein the thin film transistor may be disposed on the substrate corresponding to a display area, wherein the first pad unit and the second pad unit may be disposed in the non-display area, and wherein each of the first pad unit and the second pad unit may include a first pad electrode and a second pad electrode.

The first conductive layer may be the first pad electrode of the first pad unit, and the second conductive layer may be the first pad electrode of the second pad unit.

The first pad unit may further include a pad connection electrode disposed between the first pad electrode and the second pad electrode of the first pad unit, and the first conductive layer may be the pad connection electrode.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a substrate; and a conductive stack on the substrate, the conductive stack including:

a first conductive layer including a first sub-conductive layer and a second sub-conductive layer disposed on the first sub-conductive layer; and a second conductive layer disposed on the first conductive layer, the second conductive layer including a first sub-conductive layer and a second sub-conductive layer disposed on the first sub-conductive layer, wherein the first sub-conductive layer of the first conductive layer includes at least one selected from among a first low-reflective material, a second low-reflective material, and a third low-reflective material, wherein the first low-reflective material includes a first metal, a first metal oxide, a second metal oxide, and a third metal oxide;

wherein the second low-reflective material includes a second metal and two or more different conductive oxides; and wherein the third low-reflective material including a fourth metal oxide and two or more different conductive oxides, wherein the first sub-conductive layer of the second conductive layer includes at least one selected from the second low-reflective material and the third low-reflective material.

2. The display device of claim 1, wherein the first metal is at least one selected from among molybdenum (Mo), nickel (Ni), copper (Cu), and tungsten (W), the first metal oxide is at least one selected from among $MoO_2$, $MoO_3$, NiO, CuO and $Cu_2O$, the second metal oxide is at least one selected from among $Nb_2O_5$, $WO_3$, $TiO_2$, $ZrO_2$ and $HfO_2$, and the third metal oxide is ZnO.

3. The display device of claim 2, wherein the first low-reflective material includes a total of 70 w % to 80 wt % of the first metal and the first metal oxide; 15 w % to 25 wt % of the second metal oxide; and 0 to 5 wt % of the third metal oxide.

4. The display device of claim 3, wherein a weight ratio of the first metal to the first metal oxide is 3 to 15:85 to 97.

5. The display device of claim 1, wherein the second metal is at least one selected from molybdenum (Mo) and tungsten (W), and the conductive oxides are two or more selected from among $In_2O_3$, $SnO_2$ and ZnO.

6. The display device of claim 5, wherein the second low-reflective material includes 20 wt % to 40 wt % of the second metal and 60 wt % to 80 wt % of the conductive oxides.

7. The display device of claim 1, wherein the fourth metal oxide is at least one selected from among $MoO_3$, $MoO_2$ and $WO_3$, and the conductive oxides are two or more selected from among $In_2O_3$, $SnO_2$ and ZnO.

8. The display device of claim 7, wherein the third low-reflective material includes 50 wt % to 70 wt % of the fourth metal oxide and 30 wt % to 50 wt % of the conductive oxides.

9. The display device of claim 1, wherein each of the second low-reflective material and the third low-reflective material further includes a dopant.

10. The display device of claim 1, wherein each of the first sub-conductive layer of the first conductive layer and the first sub-conductive layer of the second conductive layer has a refractive index (n) of 2.1 to 2.9, and an extinction coefficient (k) of 0.6 to 1.2 and a thickness of 300 Å to 700 Å.

11. The display device of claim 1, wherein a resistance of the first sub-conductive layer of the second conductive layer is smaller than a resistance of the first sub-conductive layer of the first conductive layer.

12. The display device of claim 1, further comprising:

a thin film transistor including:

a gate electrode disposed on the substrate;

a gate insulating layer;

an active layer disposed on the gate electrode with the gate insulating layer interposed therebetween; and a source electrode and a drain electrode contacting the active layer, wherein the first conductive layer is the gate electrode of the thin film transistor, and the second conductive layer is at least one of the source electrode and the drain electrode of the thin film transistor.

13. The display device of claim 12, wherein the second conductive layer further includes a third sub-conductive layer disposed on the second sub-conductive layer.

14. The display device of claim 13, wherein the third sub-conductive layer is formed of the second low-reflective material, the third low-reflective material, or at least one metal material selected from among the group consisting of aluminum (Al), copper (Cu), molybdenum (Mo), titanium (Ti), and silver (Ag).

15. The display device of claim 12, further comprising:

a first pad unit and a second pad unit disposed on the substrate, wherein the display device includes a display area and a non-display area adjacent to the display area, wherein the thin film transistor is disposed on the substrate corresponding to the display area, wherein the first pad unit and the second pad unit are disposed in the non-display area, and wherein each of the first pad unit and the second pad unit includes a first pad electrode and a second pad electrode.

16. The display device of claim 15, wherein the first conductive layer is the first pad electrode of the second pad unit, and the second conductive layer is the first pad electrode of the first pad unit.

17. The display device of claim 15, wherein the second pad unit further includes a pad connection electrode disposed between the first pad electrode and the second pad electrode of the second pad unit, and wherein the second conductive layer is the pad connection electrode.

18. The display device of claim 1, further comprising:

a thin film transistor including an active layer disposed on the substrate;

a gate insulating layer;

a gate electrode disposed on the active layer with the gate insulating layer interposed therebetween; and a source electrode and a drain electrode contacting the active layer, wherein the second conductive layer is at least one of the gate electrode, the source electrode, and the drain electrode of the thin film transistor.

19. The display device of claim 18, further comprising:

a light blocking layer disposed on the substrate, wherein the first conductive layer is the light blocking layer.

20. The display device of claim 19, further comprising:

a first pad unit and a second pad unit disposed on the substrate, wherein the display device includes a display area and a non-display area adjacent to the display area, wherein the thin film transistor is disposed on the substrate corresponding to a display area, wherein the first pad unit and the second pad unit are disposed in the non-display area, and wherein each of the first pad unit and the second pad unit includes a first pad electrode and a second pad electrode.

21. The display device of claim 20, wherein the first conductive layer is the first pad electrode of the first pad unit, and the second conductive layer is the first pad electrode of the second pad unit.

22. The display device of claim 20, wherein the first pad unit further includes a pad connection electrode disposed between the first pad electrode and the second pad electrode of the first pad unit, and the first conductive layer is the pad connection electrode.

23. A display device, comprising:

a lower substrate;

an upper substrate on the lower substrate;

a thin film transistor disposed on the upper substrate, the thin film transistor having a gate electrode including a first sub-conductive layer and a second sub-conductive layer disposed on the first sub-conductive layer; and a pad electrode disposed on the upper substrate, wherein the first sub-conductive layer includes a first low-reflective material, and wherein the second sub-conductive layer includes a second low-reflective material or a third low-reflective material, wherein the first low-reflective material includes a first metal, a first metal oxide, a second metal oxide, and a third metal oxide, wherein the second low-reflective material includes a second metal and two or more different conductive oxides, and wherein the third low-reflective material includes a fourth metal oxide and two or more different conductive oxides.

24. The display device of claim 23, wherein the first metal is at least one selected from among molybdenum (Mo), nickel (Ni), copper (Cu), and tungsten (W), the first metal oxide is at least one selected from among $MoO_2$, $MoO_3$, NiO, CuO and $Cu_2O$, the second metal oxide is at least one selected from among $Nb_2O_5$, $WO_3$, $TiO_2$, $ZrO_2$ and $HfO_2$, and the third metal oxide is ZnO.

25. The display device of claim 23, wherein the second metal is at least one selected from molybdenum (Mo) and tungsten (W), and the conductive oxides are two or more selected from among $In_2O_3$, $SnO_2$ and ZnO.

* * * * *